United States Patent
Chang et al.

(10) Patent No.: US 11,567,516 B2
(45) Date of Patent: Jan. 31, 2023

(54) POWER MANAGEMENT CIRCUIT AND METHOD FOR INTEGRATED CIRCUIT HAVING MULTIPLE POWER DOMAINS

(71) Applicant: M31 TECHNOLOGY CORPORATION, Hsinchu County (TW)

(72) Inventors: Ching-Hsiang Chang, Hsinchu County (TW); Chih-Chieh Yao, Hsinchu County (TW); Chun-Hsiang Lai, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/921,842

(22) Filed: Jul. 6, 2020

(65) Prior Publication Data
US 2021/0004030 A1    Jan. 7, 2021

Related U.S. Application Data

(60) Provisional application No. 62/870,830, filed on Jul. 5, 2019.

(51) Int. Cl.
  *G05F 1/46* (2006.01)
  *H03K 3/037* (2006.01)
  (Continued)

(52) U.S. Cl.
  CPC ............... *G05F 1/46* (2013.01); *H03K 3/037* (2013.01); *H03K 5/00* (2013.01); *H03K 19/20* (2013.01); *H03K 2005/00078* (2013.01)

(58) Field of Classification Search
  CPC ........ H03K 17/223; H03K 3/037; H03K 5/00; H03K 19/20; G05F 1/46
  See application file for complete search history.

(56) References Cited

U.S. PATENT DOCUMENTS

| 7,804,327 B2 * | 9/2010 | Jao ................... H03K 3/356182 326/80 |
| 7,863,963 B2 * | 1/2011 | Zhang .............. H03K 3/356113 327/333 |

(Continued)

FOREIGN PATENT DOCUMENTS

TW            I463797 B     12/2014

OTHER PUBLICATIONS

Prakash, Rahul. Zero quiescent current, delay adjustable, power-on-reset circuit. In: 2014 IEEE Dallas Circuits and Systems Conference (DCAS) IEEE, 2014. p. 1-4.

(Continued)

*Primary Examiner* — Ryan Johnson
*Assistant Examiner* — Colleen J O Toole
(74) *Attorney, Agent, or Firm* — WPAT, P.C., Intellectual Property Attorneys; Anthony King

(57) ABSTRACT

A power management circuit includes an inverter circuit and a latch circuit. The inverter circuit is configured to receive a first control signal from an inverter input terminal and generate a second control signal at an inverter output terminal. The first control signal carries power status information of a first supply voltage. The latch circuit has a latch supply terminal, a first latch input terminal and a second latch input terminal. The latch supply terminal is coupled to a second supply voltage becoming ready before the first supply voltage. The first latch input terminal and the second latch input terminal are coupled to the inverter output terminal and the inverter input terminal respectively. The latch circuit is configured to generate a third control signal according to respective signal levels of the first control signal and the second control signal, and accordingly perform power control of an integrated circuit.

20 Claims, 17 Drawing Sheets

(51) Int. Cl.
  *H03K 5/00*   (2006.01)
  *H03K 19/20*  (2006.01)

(56) References Cited

U.S. PATENT DOCUMENTS 8,339,177 B2    12/2012  Jarrar et al.
9,344,079 B2 *   5/2016  Kwon ................ G01R 19/2503

OTHER PUBLICATIONS

Chhabra, Amit; Vaderiya, Yagnesh Dineshbhai. Low-energy power-on-reset circuit for dual supply SRAM. IEEE transactions on very large scale integration (VLSI) systems, 2015, 24.5: 2003-2007.
Office Action, Cited Reference and Search Report dated Jun. 17, 2021 issued by the Taiwan Intellectual Property Office for Taiwanese Counterpart Application No. 109122822.
English Abstract of TWI463797B.

* cited by examiner

POWER MANAGEMENT CIRCUIT AND METHOD FOR INTEGRATED CIRCUIT HAVING MULTIPLE POWER DOMAINS

PRIORITY CLAIM AND CROSS-REFERENCE

The present application claims priority to U.S. Provisional Patent Application No. 62/870,830, filed on Jul. 5, 2019, which is incorporated by reference herein in its entirety.

BACKGROUND

The present disclosure relates to power management and, more particularly, to a power management circuit for an integrated circuit having multiple power domains, a method for managing an integrated circuit having multiple power domains.

A system-on-chip (SoC) design can implement various functions by integrating different circuit blocks, including analog and digital circuits, onto a single chip. To reduce power consumption, an SoC may be divided into different power domains which can withstand different voltage levels, respectively. A power domain refers to a collection of hierarchical instances that share a same power supply. For example, each circuit block can operate at a suitable voltage level to reduce dynamic and static power consumption. In addition, unused power domains can be powered off such that circuit blocks therein can be disabled to reduce leakage power consumption.

SUMMARY

The described embodiments provide a power management circuit for an integrated circuit having multiple power domains, and a power management scheme including power-on control and power isolation in a circuit design having multiple power domains.

Some embodiments described herein may include a power management circuit for an integrated circuit. The power management circuit includes an inverter circuit and a latch circuit. The inverter circuit has an inverter input terminal and an inverter output terminal. The inverter circuit is configured to receive a first control signal from the inverter input terminal and generate a second control signal at the inverter output terminal. The first control signal carries power status information of a first supply voltage supplied to the integrated circuit. The latch circuit has a latch supply terminal, a first latch input terminal and a second latch input terminal. The latch supply terminal is coupled to a second supply voltage supplied to the integrated circuit. The second supply voltage becomes ready before the first supply voltage. The first latch input terminal is coupled to the inverter output terminal to receive the second control signal. The second latch input terminal is coupled to the inverter input terminal to receive the first control signal. The latch circuit is configured to generate a third control signal according to respective signal levels of the first control signal and the second control signal, and accordingly perform power control of the integrated circuit.

Some embodiments described herein may include a power management circuit for an integrated circuit. The power management circuit includes a level shifter and an output buffer. The level shifter, supplied at least by a first supply voltage operative in a first power domain of the integrated circuit, is configured to translate a first control signal to a second control signal operative in the first power domain. The first control signal indicates a power status of a second supply voltage operative in a second power domain of the integrated circuit. The first supply voltage becomes ready before the second supply voltage. The second power domain is different from the first power domain. The output buffer, coupled to the level shifter, is configured to buffer the second control signal to generate a third control signal, and accordingly perform power control of the integrated circuit.

Some embodiments described herein may include a method for managing an integrated circuit. The method includes: operating a level shifter at a first supply voltage supplied to a first power domain of the integrated circuit, wherein the first power domain is arranged to receive an input signal from a second power domain of the integrated circuit supplied with a second supply voltage; when the first supply voltage is ready and the second supply voltage is unready, utilizing the level shifter to translate a first control signal to a second control signal of a first logic level to isolate the second power domain from the first power domain, wherein the first control signal at least indicates a power status of the second supply voltage; and when each of the first supply voltage is ready and the second supply voltage is ready, utilizing the level shifter to translate the first control signal to the second control signal of a second logic level to allow the first power domain to receive the input signal from the second power domain.

The proposed power management scheme can perform power control operations upon of an integrated circuit, such as power-on control operations or power isolation, while achieving zero quiescent current. In addition, the proposed power management scheme can use a single control signal to perform power isolation between various power domains, thus reducing circuit chip area and power consumption. A physical layer of the integrated circuit can tolerate various power-on/off sequences.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
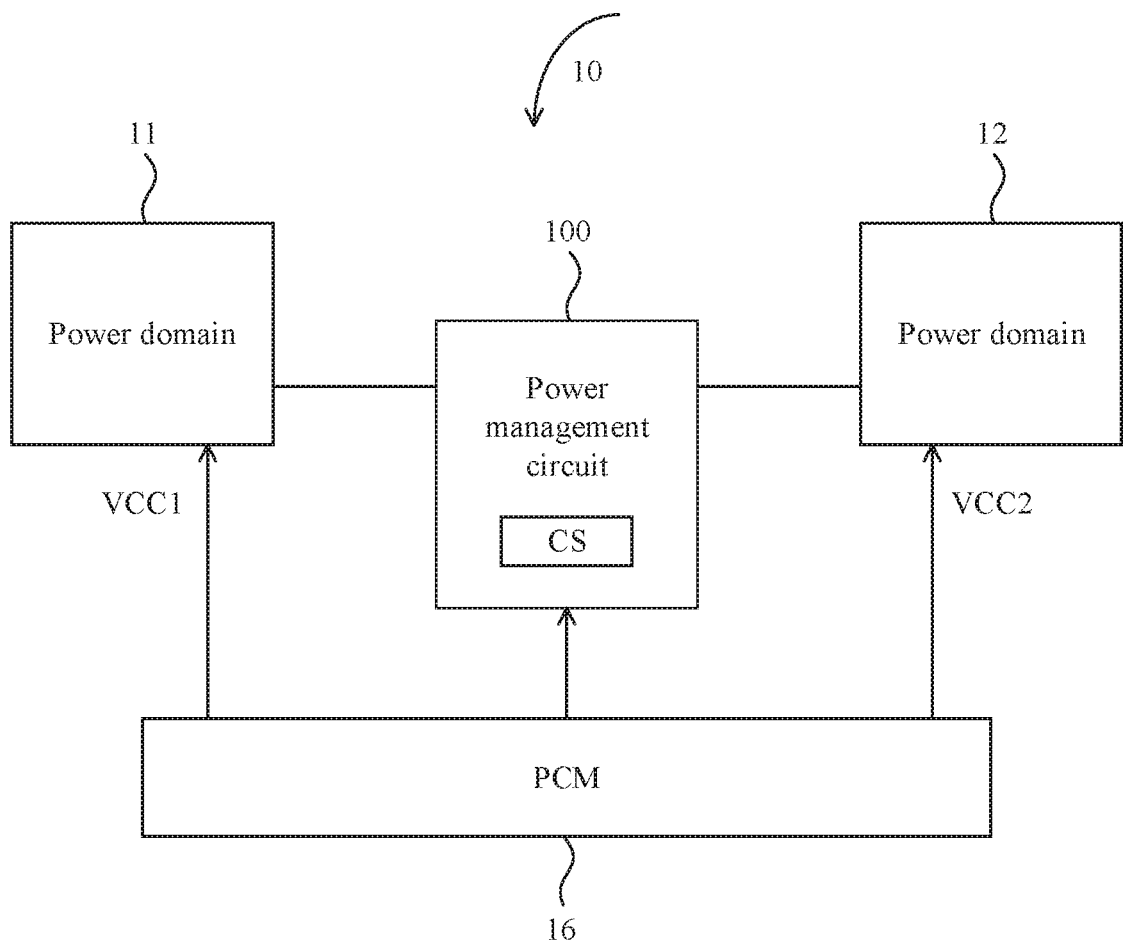
FIG. 1 illustrates an exemplary integrated circuit including multiple power domains in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, parameter values in the description that follows may vary depending on a given technology node such as an advanced CMOS technology node, an advanced FinFET technology node or other semiconductor technology nodes. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In a circuit system having multiple power domains, power-supply sequencing is used to reduce a transient inrush current to a tolerable level. An incorrect power-on sequence of power supplies will result in damage to the circuit system. For example, unwanted propagation of signals from a power-down domain to a power-on domain would cause a large inrush current in a functioning block in the power-on domain because the functioning block receives an input signal having an unknown state from the power-down domain. To reduce such leakage power, a control signal dedicated to the power-on domain is utilized to perform power isolation to thereby disconnect the power-down domain from the functioning block in the power-on domain. However, the circuit design will utilize numerous control signals which are dedicated to the different power domains of the circuit design respectively, thus resulting in increased chip area and power consumption.

Another concern is power consumption of power-on control (POC) which includes power-on reset (POR) and brownout detection (BOD). For example, after a circuit system supplied by a supply voltage is powered up, a POC circuit may put the circuit system in a reset state until the supply voltage is stabilized. When the supply voltage is stabilized, the POC circuit may release the circuit system from the reset state and initialize the circuit system. The POC circuit, however, consumes non-zero quiescent current. Power consumption caused by the non-zero quiescent current accounts for a large portion of the overall power consumption in low power applications.

The present disclosure describes exemplary power management circuits for an integrated circuit. The integrated circuit may have a plurality of power domains, including a first power domain supplied with a first supply voltage and a second power domain supplied with a second supply voltage. The exemplary power management circuits can perform power control of the integrated circuit according to the second supply voltage and a control signal, which can carry power status information of the first supply voltage. The second supply voltage may become ready or available before the first supply voltage. In some embodiments, the power control includes, but is not limited to, power-on reset, brownout detection and power isolation between different power domains. In some embodiments, the control signal may be a delayed version of the first supply voltage, a power status signal indicating if the first supply voltage is ready, or other types of control signals capable of carrying the power status information of the first supply voltage.

In some embodiments, at least one of the exemplary power management circuits may be implemented to include a latch circuit controlled by the control signal. In some embodiments, at least one of the exemplary power management circuits may be implemented to include a level shifter controlled by the control signal. In some embodiments, the level shifter may be implemented using a latch-type level shifter, a single-ended level shifter or other types of level shifters. In some embodiments, at least one of the exemplary power management circuits may utilize a same control signal to implement power isolation between any two of the power domains of the integrated circuit. Additionally, or alternatively, at least one of the exemplary power management circuits may consume zero quiescent current during the power control operations. Further description is provided below.

Referring to FIG. 1, an exemplary integrated circuit 10 including multiple power domains 11 and 12 is illustrated in accordance with some embodiments of the present disclosure. The power domains 11 and 12 are supplied with different supply voltages VCC1 and VCC2 respectively. When the power domain 11 is powered up, it takes some time for the supply voltage VCC1 to become available or ready for use. Similarly, when power domain 12 is powered up, it takes some time for the supply voltage VCC2 to become available or ready for use. The supply voltages VCC1 and VCC2 can be provided by a power control module (PCM) 16 in an always-on power domain. The PCM 16 may be an on-chip PCM within the integrated circuit 10 or an off-chip PCM external to the integrated circuit 10. In some embodiments, one of the supply voltages VCC1 and VCC2 may be a core voltage at which a processor core operates, and the other of the supply voltages VCC1 and VCC2 may be an input/output (I/O) voltage at which an I/O circuit operates. The processor core is configured to control the I/O circuit.

A power management circuit 100, coupled to the power domains 11 and 12, can be configured to perform power control of the integrated circuit 10 according to the supply voltage VCC2 and a control signal CS carrying power status information of the supply voltage VCC1. The power control performed by the power management circuit 100 may include, but is not limited to, power-on reset, brownout detection and power isolation between the power domains 11 and 12. The power isolation may also be referred to as power gating or power shut-off (PSO). For example, in some embodiments where the supply voltage VCC2 becomes ready before the supply voltage VCC1, the power management circuit 100 may detect if the supply voltage VCC1 is ready according to the supply voltage VCC2 and the control signal CS, and accordingly perform POC operations upon the integrated circuit 10. Additionally, or alternatively, in some embodiments where the supply voltage VCC2 operative in the power domain 12 becomes ready before the supply voltage VCC1 operative in the power domain 11, the power management circuit 100 may selectively isolate the power domain 11 from the power domain 12 according to the supply voltage VCC2 and the control signal CS.

The control signal CS may be implemented using, but is not limited to, the supply voltage VCC1, a delayed version of the supply voltage VCC1, or a power status signal indicating if the supply voltage VCC1 is ready. For example, the power status signal can indicate if the supply voltage VCC1 reaches a threshold level. The supply voltage VCC1 is unready when a voltage level thereof is lower than the threshold level. The supply voltage VCC1 is ready when the voltage level thereof reaches or exceeds the threshold level. In some embodiments, the control signal CS may be implemented using a power status signal indicating if each of the supply voltages VCC1 and VCC2 is ready. For example, the control signal CS may be implemented using a power status signal provided from an always-on power domain.

In the present embodiment, the power management circuit 100 can be implemented as an on-chip circuit within the integrated circuit 10. However, this is not intended to limit the scope of the present disclosure. In some embodiments, the power management circuit 100 can be implemented using an off-chip circuit external to the integrated circuit 10. In some embodiments, the power management circuit 100 may be integrated into the PCM 16 without departing from the scope of the present disclosure.

Figure 2:
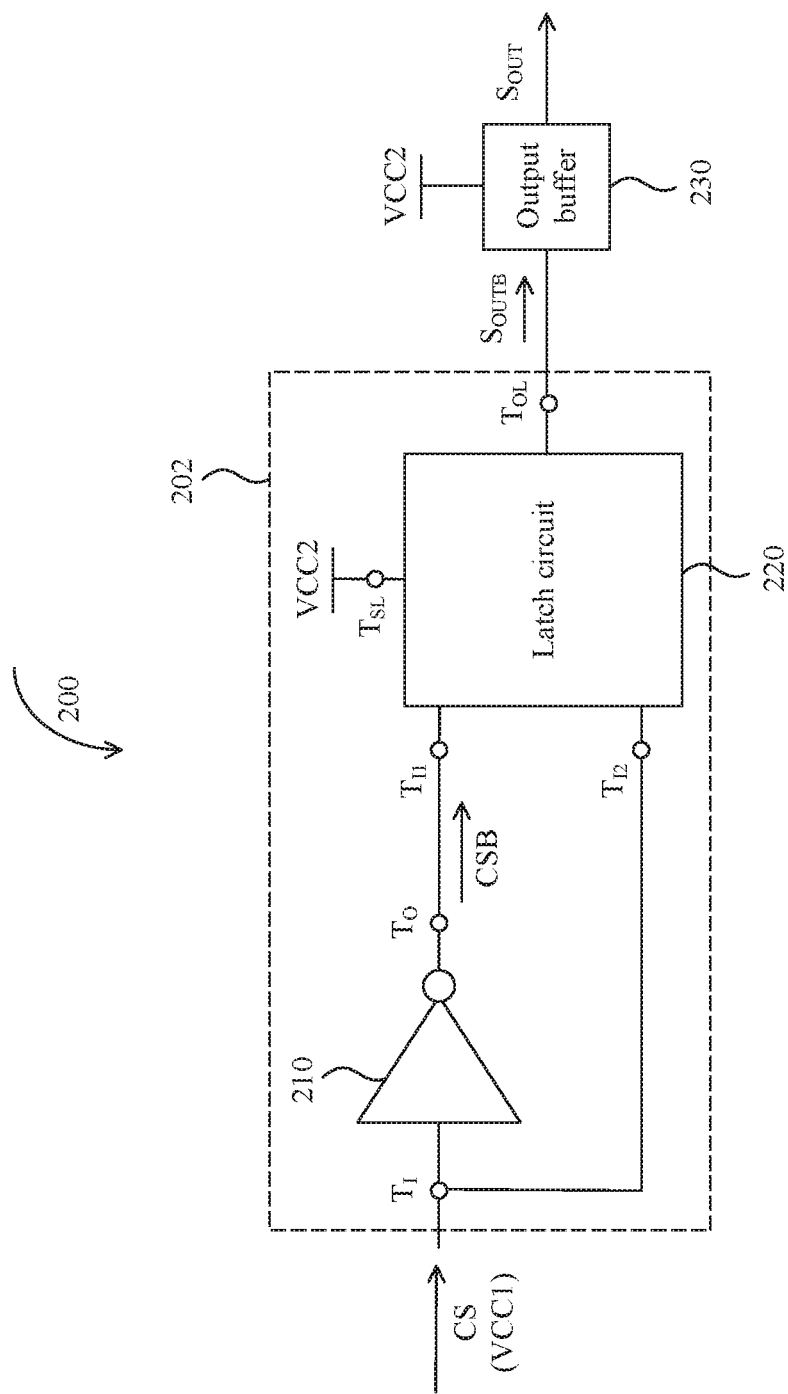
FIG. 2 is a block diagram illustrating at least a portion of an exemplary power management circuit in accordance with some embodiments of the present disclosure.

FIG. 2 is a block diagram illustrating at least a portion of an exemplary power management circuit in accordance with some embodiments of the present disclosure. The power management circuit 200 can be used to implement at least a portion of the power management circuit 100 shown in FIG. 1. The power management circuit 200 includes, but is not limited to, an inverter circuit 210 and a latch circuit 220. The inverter circuit 210 has an inverter input terminal $T_I$ and an inverter output terminal $T_O$. The inverter circuit 210 can be configured to receive the control signal CS from the inverter input terminal $T_I$, and generate a control signal CSB at the inverter output terminal $T_O$.

The latch circuit 220 has a latch supply terminal $T_{SL}$, a latch input terminal $T_{I1}$ and a latch input terminal $T_{I2}$. The latch supply terminal $T_{SL}$ is coupled to the supply voltage VCC2. The latch input terminal $T_{I1}$ and the latch input terminal $T_{I2}$ are coupled to the inverter output terminal $T_O$ and the inverter input terminal $T_I$, respectively. The latch circuit 220 can be configured to generate a control signal $S_{OUTB}$ according to respective signal levels at the latch input terminal $T_{I1}$ and the latch input terminal $T_{I2}$, and accordingly perform power control of the integrated circuit 10 shown in FIG. 1. In other words, the latch circuit 220 can be configured to generate the control signal $S_{OUTB}$ according to the control signal CSB inputted to the latch input terminal $T_{I1}$ and the control signal CS inputted to the latch input terminal $T_{I2}$. In some embodiments, the control signal $S_{OUTB}$ may be operative in a same power domain as the supply voltage VCC2.

The control signal $S_{OUTB}$ outputted from the latch circuit 220 may present the power status information of the supply voltage VCC1 since the control signal CS carrying the power status information is inputted to the latch circuit 220. The power status information may indicate, for example, a voltage level of the supply voltage VCC1, or a power status of the supply voltage VCC1 such as whether or not the supply voltage VCC1 is ready. In addition, the latch circuit 220 may start to operate properly when the supply voltage VCC2 reaches a threshold level and hence becomes ready. As a result, the control signal $S_{OUTB}$ may also indicate if each of the supply voltages VCC1 and VCC2 is ready.

In some embodiments, when the power status information indicates that the supply voltage VCC1 is unready, one of the respective signal levels at the latch input terminals $T_{I1}$ and $T_{I2}$ is higher than the other of the respective signal levels at the latch input terminals $T_{I1}$ and $T_{I2}$. The control signal $S_{OUTB}$ may be of a first level, e.g. one of a logic high level and a logic low level. When the power status information indicates that the supply voltage VCC1 is ready, the one of the respective signal levels at the latch input terminals $T_{I1}$ and $T_{I2}$ is lower than the other of the respective signal levels at the latch input terminals $T_{I1}$ and $T_{I2}$. The control signal $S_{OUTB}$ may be of a second level different from the first level, e.g. the other of the logic high level and the logic low level. As a result, when the supply voltage VCC2 becomes ready before the supply voltage VCC1, the control signal $S_{OUTB}$ may be of different levels before and after the supply voltage VCC1 becomes ready.

For example, when the power status information indicates that the supply voltage VCC1 is unready, a signal level of the control signal CSB generated from the inverter circuit 210 may be higher than a signal level of the control signal CS. When the power status information indicates that the supply voltage VCC1 is ready, the signal level of the control signal CSB may be lower than the signal level of the control signal CS. As another example, when the power status information indicates that the supply voltage VCC1 is unready, the signal level of the control signal CSB may be lower than the signal level of the control signal CS. When the power status information indicates that the supply voltage VCC1 is ready, the signal level of the control signal CSB may be higher than the signal level of the control signal CS.

In the present embodiment, the power management circuit 200 may further include an output buffer 230, configured to buffer the control signal $S_{OUTB}$ to generate a control signal $S_{OUT}$. The power management circuit 200 may perform power control of the integrated circuit 10 shown in FIG. 1 according to the control signal $S_{OUT}$. In some embodiments, the output buffer 230 may be provided for reducing loading effects and/or changing a signal level of the control signal $S_{OUTB}$. The output buffer 230 may be implemented using, but is not limited to, a buffer amplifier, a voltage follower or an inverter circuit. In some embodiments, the output buffer 230 may be optional. The power management circuit 200 may directly output the control signal $S_{OUTB}$ to thereby perform power control of the integrated circuit 10 shown in FIG. 1 without departing from the scope of the present disclosure.

In some embodiments, the control signal $S_{OUTB}$ outputted from the latch circuit 220 may be operative in a power domain different from which the control signal CS inputted to the inverter circuit 210 is operative in. By way of example but not limitation, the control signal CS may be implemented using the supply voltage VCC1 or a delayed version of the supply voltage VCC1, which is operative in the power domain 11 different from the power domain 12 where the control signal $S_{OUTB}$ in operative. As another example, the control signal CS may be implemented using a power status signal provided from an always-on power domain different from the power domain 12. As a result, the inverter circuit 210 and the latch circuit 220 may be used to implement at least a portion of a level shifter 202, which is configured to translate the control signal CS to the control signal $S_{OUTB}$ operative in the power domain 12. The control signal CS can be operative in a power domain different from the power domain 12. In the present embodiment, the level shifter 202 may be regarded as a latch-type level shifter. In some embodiment, the proposed power management scheme may utilize a single-ended level or other types of level shifters to produce the control signal $S_{OUTB}$ without departing from the scope of the present disclosure. Associated description will be provided later.

Referring now to FIG. 1 and FIG. 2, in some embodiments, the power management circuit 200 can be configured to perform POC operations upon the integrated circuit 10 according to the control signal $S_{OUTB}/S_{OUT}$. The latch circuit 220 operates at the supply voltage VCC2 which may become ready before the supply voltage VCC1. When the power status information carried by the control signal CS indicates that the supply voltage VCC1 is unready, the latch circuit 220 can be configured to generate the control signal $S_{OUTB}$ to hold the integrated circuit 10 in a reset state. For example, the latch circuit 220 may generate control signal $S_{OUTB}$ of the first level to hold at least one circuit block operating in the power domain 12 in the reset state, and/or hold at least one circuit block operating in the power domain 11 in the reset state. When the power status information carried by the control signal CS indicates that the supply voltage VCC1 is ready, the latch circuit 220 can be configured to generate the control signal $S_{OUTB}$ to release the integrated circuit 10 from the reset state. For example, the latch circuit 220 may generate control signal $S_{OUTB}$ of the second level to release the at least one circuit block operating in the power domain 12 from the reset state, and/or release the at least one circuit block operating in the power domain 11 from the reset state.

In some embodiments, the power management circuit 200 can be configured to provide power isolation between different power domains of the integrated circuit 10 according to the control signal $S_{OUTB}/S_{OUT}$. For example, the latch circuit 220 operates at the supply voltage VCC2 which may become ready before the supply voltage VCC1. When the power status information carried by the control signal CS indicates that the supply voltage VCC1 operative in the power domain 11 is unready, the latch circuit 220 can be configured to generate the control signal $S_{OUTB}$ to isolate the power domain 11 from a portion of the integrated circuit 10. The portion of the integrated circuit 10 operates in the power domain 12. When the power status information carried by the control signal CS indicates that the supply voltage VCC1 operative in the power domain 11 is ready, the latch circuit 220 can be configured to generate the control signal $S_{OUTB}$ to allow the power domain 11 to be coupled to the portion of the integrated circuit 10.

It is worth noting that the proposed power management scheme may perform POC operations or power isolation while achieving zero quiescent current. For example, when each of the supply voltages VCC1 and VCC2 is ready or stable, each of the inverter circuit 210 and the latch circuit 220 may consume zero quiescent current.

Figure 3:
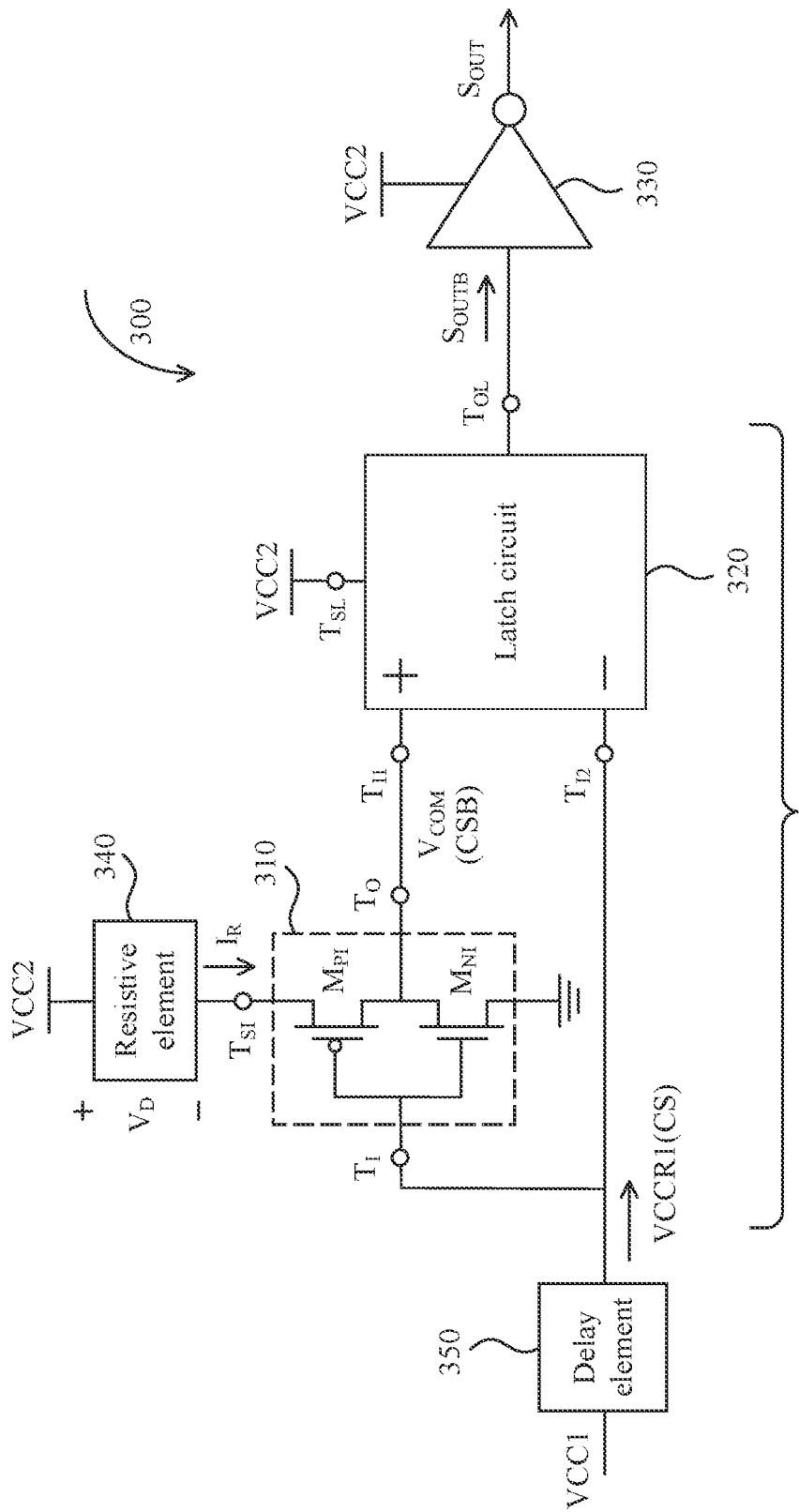
FIG. 3 illustrates an implementation of the power management circuit shown in FIG. 2 in accordance with some embodiments of the present disclosure.

To facilitate understanding of the present disclosure, some embodiments are given as follows for further description of the power management scheme. Firstly, the proposed power management scheme will be described with reference to POC applications. FIG. 3 illustrates an implementation of the power management circuit 200 shown in FIG. 2 in accordance with some embodiments of the present disclosure. In the present embodiment, the power management circuit 300 can be configured to perform POC operations of the integrated circuit 10 shown in FIG. 1. The POC operations include, but is not limited to, power-on reset and brownout detection. The power management circuit 300 may include an inverter circuit 310, a latch circuit 320, an output buffer 330, a resistive element 340 and a delay element 350. The inverter circuit 310, the latch circuit 320 and the output buffer 330 can represent embodiments of the inverter circuit 210, the latch circuit 220 and the output buffer 230 shown in FIG. 2, respectively.

In the present embodiment, the inverter circuit 310 can be implemented using a plurality of transistors $M_{PI}$ and $M_{NI}$. Respective gates of the transistors $M_{PI}$ and $M_{NI}$ are coupled to the inverter input terminal $T_I$ of the inverter circuit 310. Respective drains of the transistors $M_{PI}$ and $M_{NI}$ are coupled to the inverter output terminal $T_O$ of the inverter circuit 310. The source of the transistor $M_{PI}$ is coupled to an inverter supply terminal $T_{SI}$ of the inverter circuit 310. The source of the transistor $M_{NI}$ is coupled to a reference voltage such as a ground voltage.

The latch circuit 320 can serve as a comparator having a non-inverting terminal and an inverting terminal. In the present embodiment, the latch input terminals $T_{I1}$ and $T_{I2}$ can serve as the non-inverting terminal and the inverting terminal, respectively. As a result, when the signal level at the latch input terminal $T_{I1}$ is higher than the signal level at the latch input terminal $T_{I2}$, the control signal $S_{OUTB}$ outputted from a latch output terminal $T_{OL}$ may be of a high level or a logic high level. When the signal level at the latch input terminal $T_{I1}$ is lower than the signal level at the latch input terminal $T_{I2}$, the control signal $S_{OUTB}$ may be of a low level or a logic low level.

The output buffer 330, coupled to the latch circuit 320, can be configured to buffer the control signal $S_{OUTB}$ to generate the control signal $S_{OUT}$. In the present embodiment, the output buffer 330 may be implemented using an inverter circuit operating at the supply voltage VCC2. As a result, the power management circuit 300 can utilize an inverted signal of the control signal $S_{OUTB}$, i.e. the control signal $S_{OUT}$, to perform POC operations.

The resistive element 340, coupled between the supply voltage VCC2 and the inverter supply terminal $T_{SI}$, is arranged to produce a voltage drop $V_D$ according to a current signal $I_R$ flowing therethrough. In some embodiments, the resistive element 340 may be implemented using at least one resistor, at least one diode, at least one diode-connected transistor, at least one circuit element capable of proving an electrical resistance, and combinations thereof.

The delay element 350, coupled to the inverter input terminal $T_I$, is arranged to receive the supply voltage VCC1 and output a delayed version of the supply voltage VCC1 to the inverter input terminal $T_I$. The delayed version of the supply voltage VCC1, hereinafter referred to as a supply voltage VCCR1, can carry power status information that indicates a voltage level of the supply voltage VCC1. The supply voltage VCCR1 can represent an embodiment of the control signal CS shown in FIG. 2. A voltage signal $V_{COM}$ outputted from to the inverter output terminal $T_O$ can represent an embodiment of the control signal CSB shown in FIG. 2.

Figure 4:
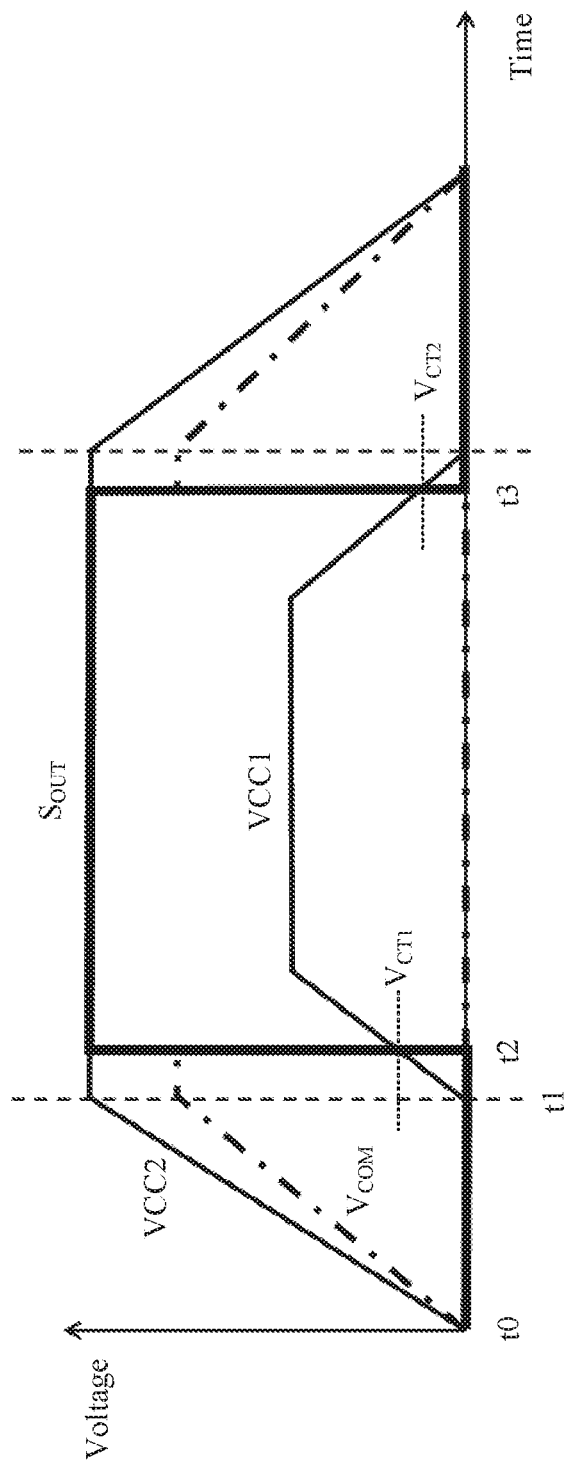
FIG. 4 illustrates signal waveforms associated with operation of the power management circuit shown in FIG. 3 in accordance with some embodiments of the present disclosure.

FIG. 4 illustrates signal waveforms associated with operation of the power management circuit 300 shown in FIG. 3 in accordance with some embodiments of the present disclosure. Referring to FIG. 4 and also to FIG. 1 and FIG. 3, at time t0, the PCM 16 may power up the power domain 12, and the supply voltage VCC2 starts to rise. As the supply voltage VCC2 is unready or not ready for use, the power management circuit 300 may put the integrated circuit 10 in a reset state. For example, the output buffer 330 may invert the control signal $S_{OUTB}$ to generate the control signal $S_{OUT}$ having a logic low level, thereby putting one or more circuit blocks operating in the power domain 12 in the reset state.

Between time t0 and time t1, as the supply voltage VCCR1/VCC1 stays at a low level, the transistor $M_{PI}$ can be turned on while the transistor $M_{NI}$ is turned off. The voltage signal $V_{COm}$ applied to the latch input terminal $T_{I1}$ may be equal to or substantially equal to (VCC2-$V_D$). When the supply voltage VCC2 reaches a threshold level such that the latch circuit 320 can operate properly, the control signal $S_{OUT}$ still stays at the logic low level since each of the supply voltages VCC1 and VCC2 is unready or not ready for use.

At time t1, the supply voltage VCC2 reaches a rated level, e.g. 3.3V. The voltage signal $V_{COM}$ may have a voltage level equal to or substantially equal to the rated level minus the voltage drop $V_D$. Additionally, the PCM 16 may power up the power domain 11, and the supply voltage VCC1/VCCR1 starts to rise. Between time t1 and time t2, as the signal level at the latch input terminal $T_{I1}$ is sufficiently higher than the signal level at the latch input terminal $T_{I2}$, the control signal $S_{OUT}$ may be a logic high level, e.g. 3.3V. The control signal $S_{OUT}$ may stay at the logic low level.

At time t2, the supply voltage VCC1 reaches or exceeds a threshold level $V_{CT1}$ such that the transistor $M_{NI}$ can be turned on. The voltage signal $V_{COM}$ may be reduced to zero or substantially zero. By way of example but not limitation, the supply voltage VCC1 will reach the threshold level $V_{CT1}$ when the supply voltage VCCR1 ramps up to a threshold voltage of the transistor $M_{NI}$. In addition, the difference between the respective signal levels at the latch input terminals $T_{I1}$ and $T_{I2}$, e.g. $|V_{COM}-VCCR1|$, will reach or exceed a transition threshold. The control signal $S_{OUTB}$ will transition from the logic high level to the logic low level, thereby indicating that the supply voltage VCC1 becomes ready. The power management circuit 300 may release the integrated circuit 10 from the reset state. For example, the output buffer 330 may invert the control signal $S_{OUT}$ to generate the control signal $S_{OUTB}$ having the logic high level, e.g. 3.3V, to thereby release the one or more circuit blocks operating in the power domain 12 from the reset state. Between time t2 and time t3, the control signal $S_{OUTB}$ stays at the logic low level, and the control signal $S_{OUT}$ stays at the logic high level. The transistor $M_{PI}$ may be turned off. The power management circuit 300 may consume zero quiescent current during a period of time in which each of the supply voltages VCC1 and VCC2 is ready.

At time t3, the supply voltage VCC1 falls below or reaches a threshold level $V_{CT2}$ because, for example, a brownout condition occurs. The transistor $M_{NI}$ can be turned off while the transistor $M_{PI}$ may be turned on. The voltage signal $V_{COM}$ may increase to be equal to or substantially equal to the rated level of the supply voltage VCC2 minus the voltage drop $V_D$. By way of example but not limitation, the supply voltage VCC1 will reach the threshold level $V_{CT2}$ when the supply voltage VCCR1 ramps down to the threshold voltage of the transistor $M_{NI}$. The control signal $S_{OUTB}$ may transition from the logic low level to the logic high level, thereby indicating that the supply voltage VCC1 becomes unready. The power management circuit 300 may therefore put the integrated circuit 10 in the reset state again. For example, the output buffer 330 may invert the control signal $S_{OUTB}$ to generate the control signal $S_{OUT}$ having the logic low level to thereby put the one or more circuit blocks operating in the power domain 12 in the reset state.

The circuit structure and operation described above with reference to FIG. 3 and FIG. 4 are provided for illustrative purposes, and are not intended to limit the scope of the present disclosure. In some embodiments, the inverter supply terminal $T_{SI}$ of the inverter circuit 310 may be directly coupled to a supply voltage, which becomes ready before the supply voltage VCC1 and has a nominal voltage level lower than that of the supply voltage VCC2. In some embodiments, the latch input terminals $T_{I1}$ and $T_{I2}$ may serve as an inverting terminal and a non-inverting terminal of a comparator. In some embodiments, the output buffer 330 may be implemented using other types of output buffers such as a voltage follower. In some embodiments, the output buffer 330 may be optional. The power management circuit 300 may directly output the control signal $S_{OUTB}$ to perform POC operations. In some embodiments, the delay element 350 may be optional. The supply voltage VCC1 may be directly inputted to the inverter input terminal $T_I$ and the latch input terminal $T_{I2}$. Such modifications and variations also fall within the contemplated scope of the present disclosure.

In some embodiments, the delay element 350 can be utilized to ensure that, when the control signal $S_{OUT}$ transitions to the logic high level, the supply voltage VCC1 has stabilized. For example, when the supply voltage VCCR1 ramps up to a voltage level, the supply voltage VCC1 may have risen above such voltage level because the supply voltage VCCR1 is the delayed version of the supply voltage VCC1. As a result, when the control signal $S_{OUT}$ transitions from the logic low level to the logic high level to indicate that the supply voltage VCC1 becomes ready, the supply voltage VCC1 is closer to a rated level thereof, e.g. 1.2V, than the supply voltage VCCR1.

Figure 5:
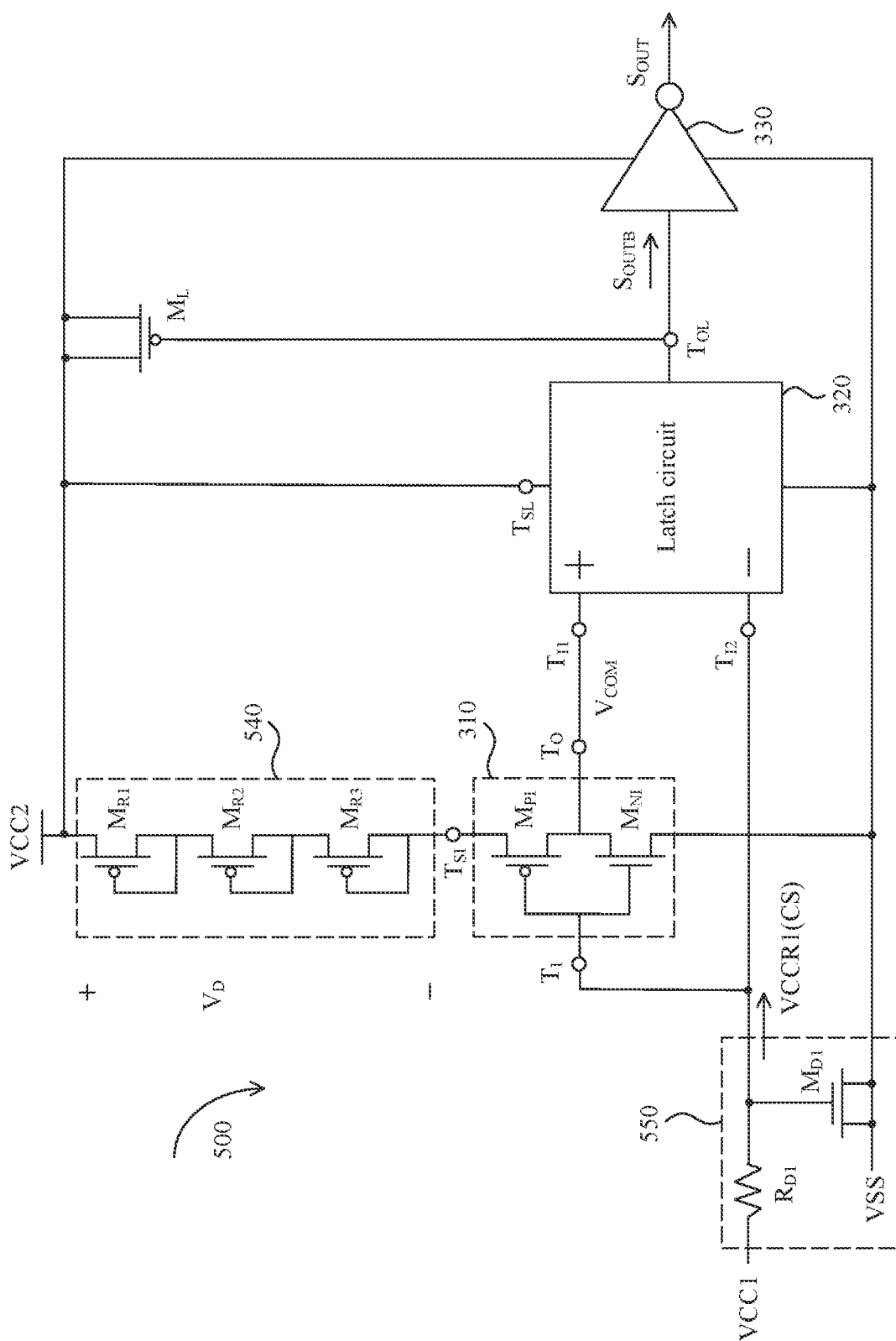
FIG. 5 illustrates an implementation of the power management circuit shown in FIG. 2 in accordance with some embodiments of the present disclosure.

Referring to FIG. 5, the delay element 350 shown in FIG. 3 may be implemented using a delay element 550, including a resistor $R_{D1}$ and a transistor $M_{D1}$, in accordance with some embodiments of the present disclosure. In the present embodiment, the resistor $R_{D1}$ is coupled to the supply voltage VCC1 to provide the supply voltage VCCR1. The gate of the transistor $M_{D1}$ is coupled to the supply voltage VCCR1. The drain and source of the transistor $M_{D1}$ are shorted. The transistor $M_{D1}$ can therefore serve as a capacitor, which is coupled between the supply voltage VCCR1 and a reference voltage VSS. The delay element 550 may act as an RC delay element. In addition, a resistive element 540 of the power management circuit 500 can represent an embodiment of the resistive element 340 shown in FIG. 3.

The resistive element 530 includes a plurality of diode-connected transistors $M_{R1}$-$M_{R3}$ which are connected in series. When each of the diode-connected transistors $M_{R1}$-$M_{R3}$ is turned on, the voltage drop $V_D$ across the resistive element 540 may be approximately equal to a sum of respective threshold voltages of the diode-connected transistors $M_{R1}$-$M_{R3}$.

In the present embodiment, the power management circuit 500 may further include a transistor $M_L$, which can serve as a capacitor coupled between the latch supply terminal $T_{SL}$ and the latch output terminal $T_{OL}$ of the latch circuit 320. During a ramp-up period of the supply voltage VCC2, the signal level at the latch output terminal $T_{OL}$ may be pulled up to the supply voltage VCC2 with the use of the transistor $M_L$.

Figure 6:
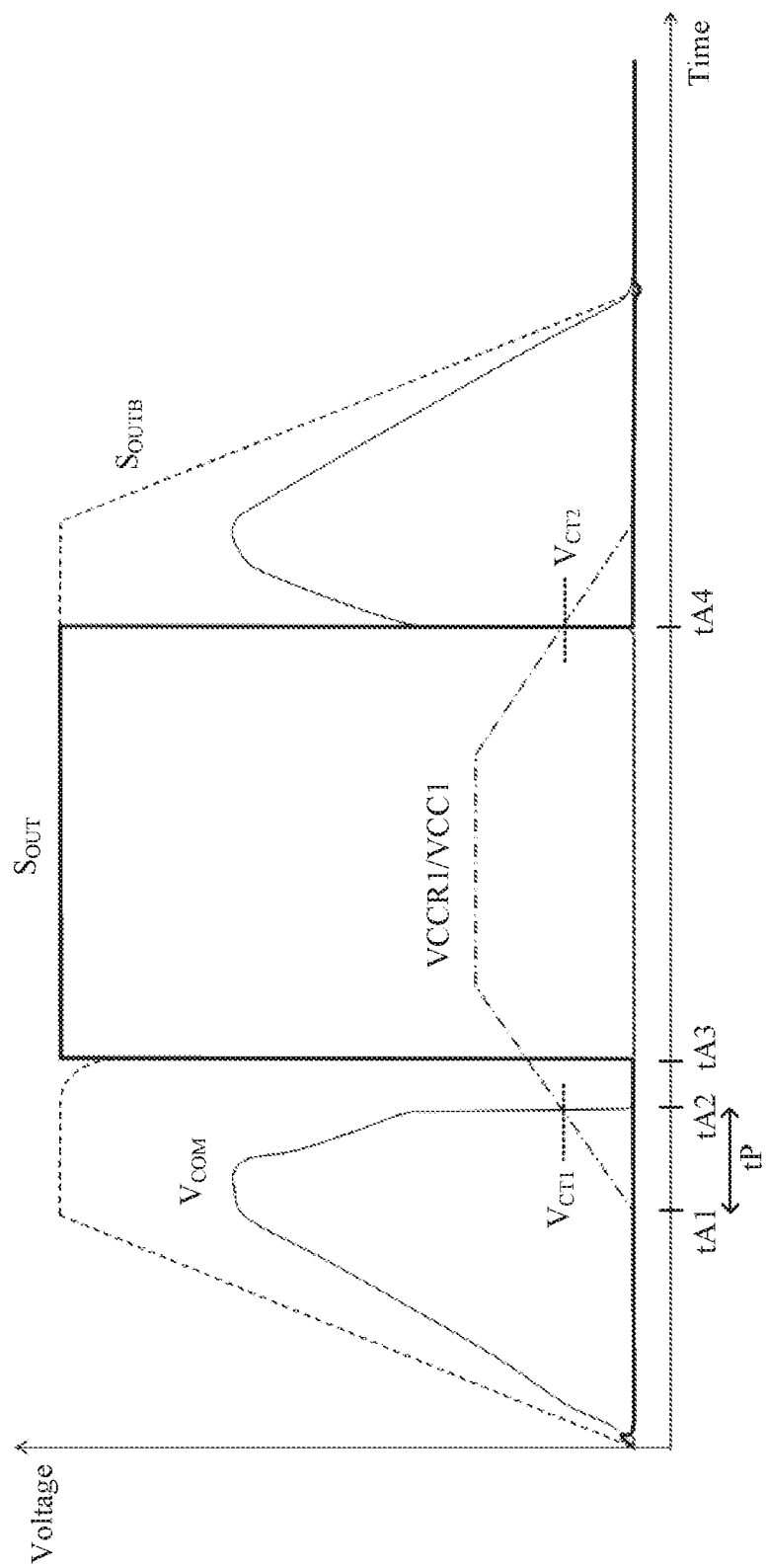
FIG. 6 illustrates signal waveforms associated with operation of the power management circuit shown in FIG. 5 in accordance with some embodiments of the present disclosure.

FIG. 6 illustrates signal waveforms associated with operation of the power management circuit 500 shown in FIG. 5 in accordance with some embodiments of the present disclosure. Referring to FIG. 6 and also to FIG. 5, at time tA1, the supply voltage VCC starts to rise. For example, the power domain 11 shown in FIG. 1 may be powered up at time tA1. In addition, the supply voltage VCCR1 may start to rise since the supply voltage VCC1 can be applied to the transistor MDI, serving as a capacitor, through the resistor $R_{D1}$. After a period of time tP has elapsed, the supply voltage VCC1 may rise to the threshold level $V_{CT1}$. The supply voltage VCCR1 may rise to the threshold voltage of the transistor $M_{NI}$. As a result, the transistor $M_{NI}$ may be turned on at time tA2. Also, the voltage signal $V_{COM}$ may be reduced to zero or substantially zero.

At time tA3, the supply voltage VCCR1 may be a transition threshold higher than the voltage signal $V_{COM}$, such that the difference between the respective signal levels at the latch input terminals $T_{I1}$ and $T_{I2}$, e.g. |VCCR1-$V_{COM}$|, may reach the transition threshold. The control signal $S_{OUTB}$ will transition from the logic high level to the logic low level. Also, the control signal $S_{OUT}$ will transition from the logic low level to the logic high level, thereby indicating that the supply voltage VCC1 becomes ready. It is worth noting that when the control signal $S_{OUT}$ transitions from the logic low level to the logic high level, the voltage level of the supply voltage VCC1 would be higher than that of the supply voltage VCCR1 because of the delay element 550. The supply voltage VCC1 would be sufficiently stable for proper device operation.

At time tA4, the supply voltage VCC1 falls below or reaches the threshold level $V_{CT2}$ because, for example, a brownout condition occurs. The supply voltage VCCR1 may fall to the threshold voltage of the transistor $M_{NI}$. The control signal $S_{OUTB}$ may transition from the logic low level to the logic high level. Also, the control signal $S_{OUT}$ will transition from the logic high level to the logic low level, thereby indicating that the supply voltage VCC1 becomes unready. In the present embodiment, the threshold level $V_{CT2}$ may be equal to the threshold level $V_{CT1}$.

As those skilled in the art can appreciate operation of the power management circuit 500 after reading the above paragraphs directed to FIG. 1 through FIG. 4, further description is omitted here for brevity.

Referring back to FIG. 3 and FIG. 4, in some embodiments, the delay element 350 can be utilized to provide hysteresis to increase noise immunity and system stability. For example, the delay element 350 may be implemented using a delay element with hysteresis, which is configured to generate a delayed version of the supply voltage VCC1. During a ramp-up period of the supply voltage VCC1, the delayed version of the supply voltage VCC1 ramps up to a reference level when the supply voltage VCC1 ramps up to a first threshold level. During a ramp-down period of the supply voltage VCC, the delayed version of the supply voltage VCC1 may ramp down to the reference level when the supply voltage VCC1 ramps down to a second threshold level lower than the first threshold level. In some embodiments where the reference level is a voltage level of the threshold voltage of the transistor $M_{NI}$, the first threshold level and the second threshold level may be the threshold level $V_{CT1}$ and the threshold level $V_{CT2}$, respectively. When the supply voltage VCC1 ramps down to a voltage level between the threshold levels $V_{CT1}$ and $V_{CT2}$ because of noise, the control signal $S_{OUT}$ may stay at the logic high level since the supply voltage VCCR1 may still have a voltage level higher than that of the threshold voltage of the transistor $M_{NI}$. The delay element with hysteresis may therefore reduce false transitions in the control signal $S_{OUTB}$/$S_{OUT}$.

Figure 7:
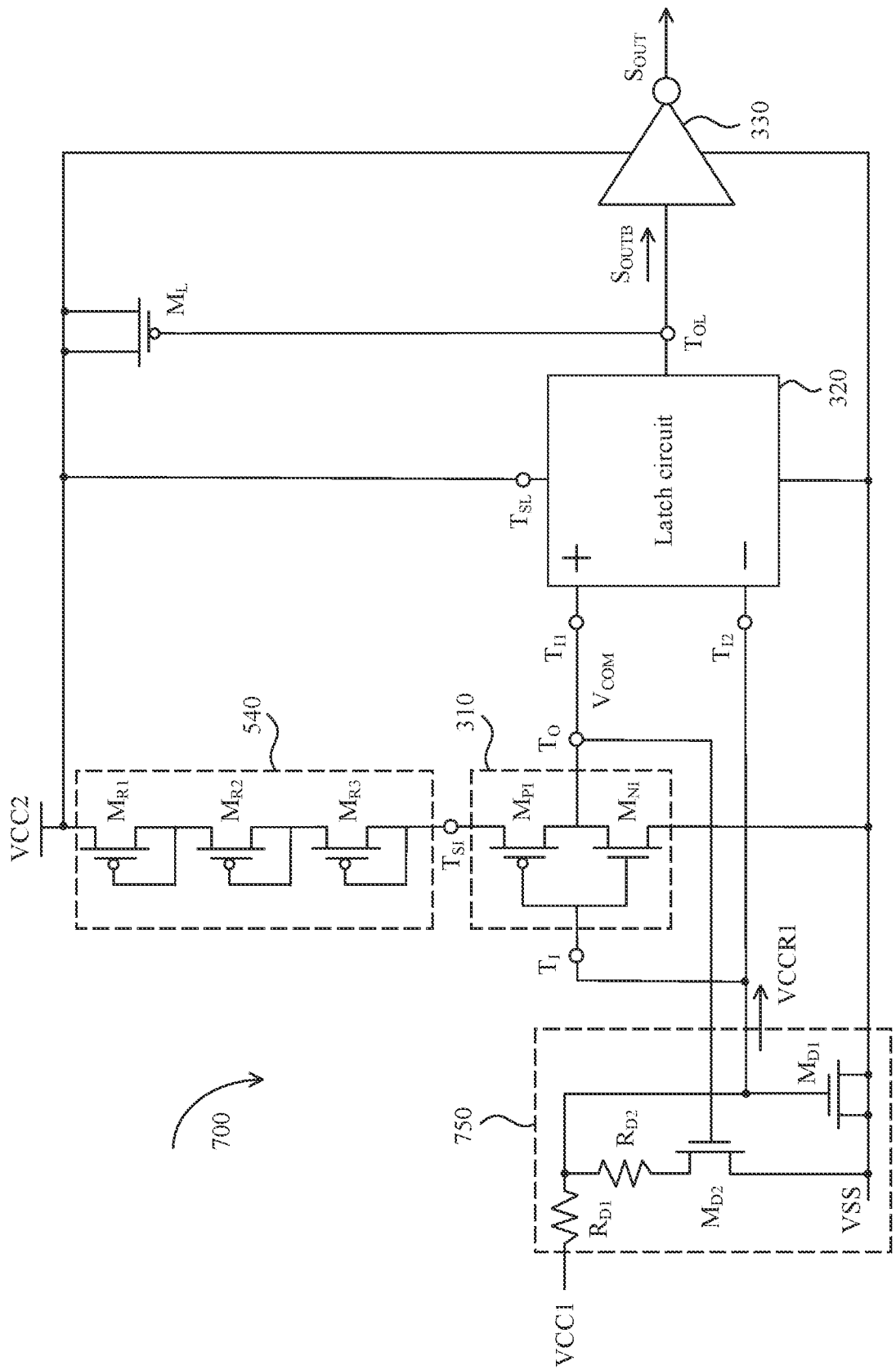
FIG. 7 illustrates an implementation of the power management circuit shown in FIG. 2 in accordance with some embodiments of the present disclosure.

Referring to FIG. 7, the delay element 350 shown in FIG. 3 may be implemented using a delay element 750 in accordance with some embodiments of the present disclosure. The circuit structure of the power management circuit 700 is similar/identical to that of the power management circuit 500 shown in FIG. 5 except that the delay element 750 further includes a resistor $R_{D2}$ and a transistor $M_{D2}$. In the present embodiment, one end of the resistor $R_{D2}$ is coupled between the inverter input terminal $T_I$ and the transistor $M_{D2}$. The transistor $M_{D2}$ is arranged to selectively couple another end of the resistor $R_{D2}$ to the reference voltage VSS according to the voltage signal $V_{COM}$.

Figure 8:
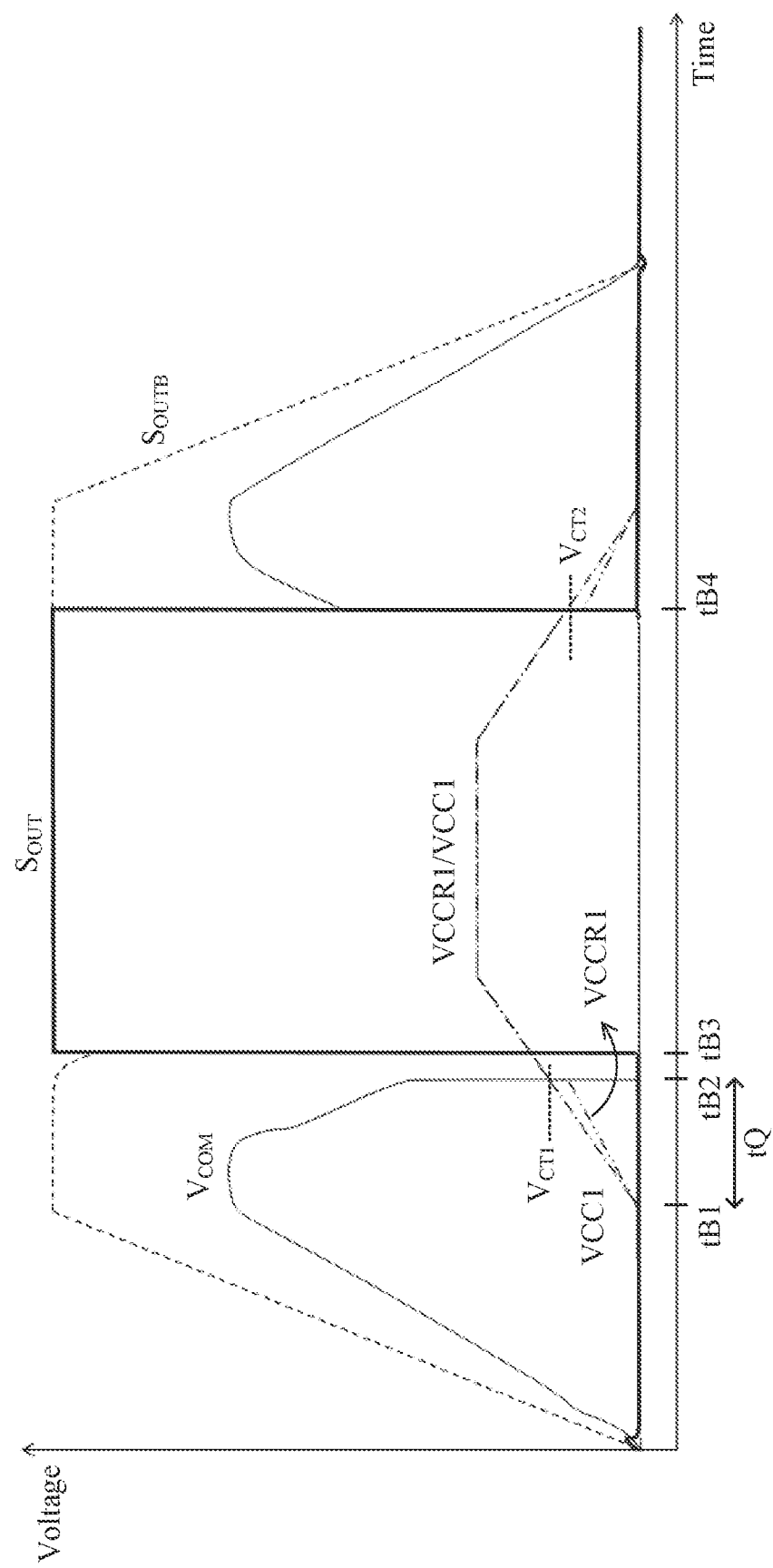
FIG. 8 illustrates signal waveforms associated with operation of the power management circuit shown in FIG. 7 in accordance with some embodiments of the present disclosure.

FIG. 8 illustrates signal waveforms associated with operation of the power management circuit 700 shown in FIG. 7 in accordance with some embodiments of the present disclosure. Referring to FIG. 8 and also to FIG. 7, at time tB1, the supply voltage VCC1 starts to rise from a low voltage level. The transistor $M_{PI}$ may be turned on while the transistor $M_{NI}$ is turned off. The voltage signal $V_{COM}$ may be of a sufficiently high level to turn on the transistor $M_{D2}$. As a result, the resistors $R_{D1}$ and $R_{D2}$ can serve as a voltage divider to divide the supply voltage VCC1. The supply voltage VCCR1 may start to rise since the supply voltage VCC1 can be applied to the transistor $M_{D1}$, serving as a capacitor, through the voltage divider. The supply voltage VCCR1 may be regarded as a divided voltage with respect to the supply voltage VCC1.

After a period of time tQ has elapsed, the supply voltage VCC1 may rise to the threshold level $V_{CT1}$. Also, the supply voltage VCCR1 may rise to the threshold voltage of the transistor $M_{NI}$. The transistor $M_{NI}$ may be turned on at time tB2. In some embodiments, the period of time tQ is longer than the period of time tP shown in FIG. 6 since the threshold level $V_{CT1}$ shown in FIG. 8 may be higher than the threshold level $V_{CT1}$ shown in FIG. 6. Between time tB2 and time tB3, the transistor $M_{PI}$ may be turned off. The voltage signal $V_{COM}$ may be of a low level such that the transistor $M_{D2}$ is turned off. The voltage level of the supply voltage VCCR1 may be substantially equal to that of the supply voltage VCC1.

At time tB3, the difference between the respective signal levels at the latch input terminals $T_{I1}$ and $T_{I2}$, e.g. |VCCR1-$V_{COM}$|, may reach a transition threshold. The control signal $S_{OUTB}$ will transition from the logic high level to the logic low level. Also, the control signal $S_{OUT}$ will transition from the logic low level to the logic high level, thereby indicating that the supply voltage VCC1 becomes ready.

At time tB4, the supply voltage VCC1 falls below or reaches the threshold level $V_{CT2}$ because, for example, a brownout condition occurs. The supply voltage VCCR1 may fall below or reaches the threshold voltage of the transistor $M_{NI}$. The transistor $M_{NI}$ may be turned off while the transistor $M_{PI}$ can be turned on. The voltage signal $V_{COM}$ may be of a sufficiently high level to turn on the transistor $M_{D2}$. The supply voltage VCCR1 may again become a divided voltage with respect to the supply voltage VCC. The control signal $S_{OUT}$r may transition from the logic low level to the logic high level. Also, the control signal $S_{OUT}$ will transition from the logic high level to the logic low level, thereby indicating that the supply voltage VCC becomes unready. In some embodiments, the threshold level $V_{CT2}$ shown in FIG. 8 may be equal to the threshold level $V_{CT2}$ shown in FIG. 6.

As those skilled in the art can appreciate operation of the power management circuit 700 after reading the above paragraphs directed to FIG. 1 through FIG. 6, further description is omitted here for brevity.

Figure 9:
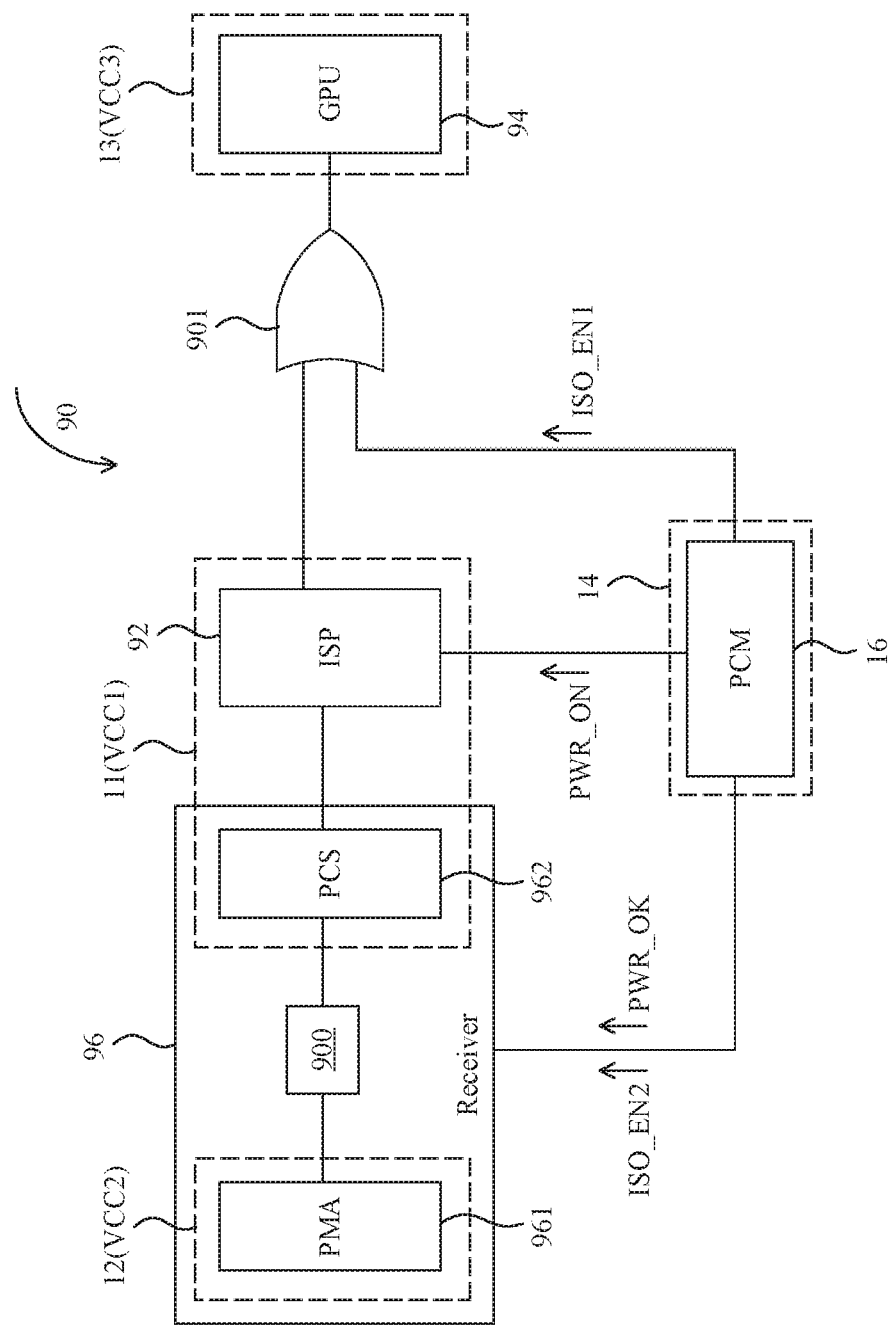
FIG. 9 illustrates an implementation of the integrated circuit shown in FIG. 1 in accordance with some embodiments of the present disclosure.

In some embodiments, the proposed power management scheme can be applied to power isolation. FIG. 9 illustrates an implementation of the integrated circuit 10 shown in FIG. 1 in accordance with some embodiments of the present disclosure. In the present embodiment, the integrated circuit 90 has multiple power domains, which includes the power domains 11 and 12 shown in FIG. 1, a power domain 13 and an always-on power domain 14. The power domains 11-13 are respectively supplied with the supply voltages VCC1-VCC3 delivered from the always-on power domain 14. In some embodiments, the power domains 11-13 may be switchable power domains.

The integrated circuit 90 may utilize one or more power gating mechanisms to perform power isolation between different power domains. For example, the integrated circuit 90 may include a power management circuit 900 arranged for power isolation between the power domains 11 and 12. The power management circuit 900 can represent an embodiment of the power management circuit 100 shown in FIG. 1. As another example, the integrated circuit 90 may include an isolation cell 901 arranged for power isolation between the power domains 11 and 13. The isolation cell 901 may be implemented using, but is not limited to, an OR gate. It is worth noting that, in some embodiments, the power management circuit 900 may be arranged for power isolation between any two of the power domains 11 to 13 without departing from the scope of the present disclosure. In addition, the isolation cell 901 may be arranged for power isolation between any two of the power domains 11 to 13 without departing from the scope of the present disclosure. Further, in some embodiments, the power management circuit 900 may be disposed within the PMA 961, PCS 962 or the PCM 16 without departing from the scope of the present disclosure.

For illustrative purposes, the integrated circuit 90 may be described below as at least a portion of an application processor (AP) supporting Mobile Industry Processor Interface (MIPI) specifications. Those skilled in the art can appreciate that the integrated circuit 90 can be implemented as an integrated circuit capable of supporting other types of communication interface specifications without departing from the scope of the present disclosure.

In the present embodiment, the integrated circuit 90 may further include the PCM 16 shown in FIG. 1, an image signal processor (ISP) 92, a graphic processing unit (GPU) 94 and a receiver 96. The PCM 16, operating in the always-on power domain 14, can be configured to provide the supply voltages VCC1-VCC3 for the power domains 11-13, and control power-on/off sequences for the power domains 11-13. Also, the PCM 16 can be configured to generate a power status signal, such as a power good signal PWR_OK, to indicate if each of the supply voltages VCC1-VCC3 is ready or ready for use.

The ISP 92, operating in the power domain 11, may be powered on by a start-up signal PWR_ON provided by the PCM 16. The GPU 94, operating in the power domain 13, may be selectively isolated from the ISP 92 by the isolation cell 901. By way of example but not limitation, when the power domain 11 is unready or not ready for use, the PCM 16 may send a control signal ISO_EN1 having a predetermined level such as a logic high level. The isolation cell 901 may therefore isolate signals from the power domain 11 to the GPU 94 in the power domain 13.

The receiver 96, such as a MIPI differential physical (D-PHY) receiver, may have a physical layer that includes a physical medium attachment layer (PMA) 961 operating in the power domain 12 and a physical coding sublayer (PCS) 962 operating in the power domain 11. With the use of the power management circuit 900 coupled between the PMA 961 and the PCS 962, the physical layer of the receiver 96 can tolerate various power-on/off sequences. By way of example but not limitation, when the power domain 11 is unready or not ready for use, the power management circuit 900 may disconnect the PCS 962 in the power domain 11 from the PMA 961 in the power domain 12 according to a control signal ISO_EN2 provided by the PCM 16. In some embodiments, the control signal ISO_EN2 may carry power status information of the supply voltage VCC1 to thereby indicate if the supply voltage VCC1 is ready. In some embodiments, the control signal ISO_EN2 may be carry respective power status information of the supply voltages VCC1 and VCC2 to thereby indicate if each of the supply voltages VCC1 and VCC2 is ready. In some embodiments, the control signal ISO_EN2 may be a power status signal such as the power good signal PWR_OK or an inverted signal of the power good signal PWR_OK.

Figure 10:
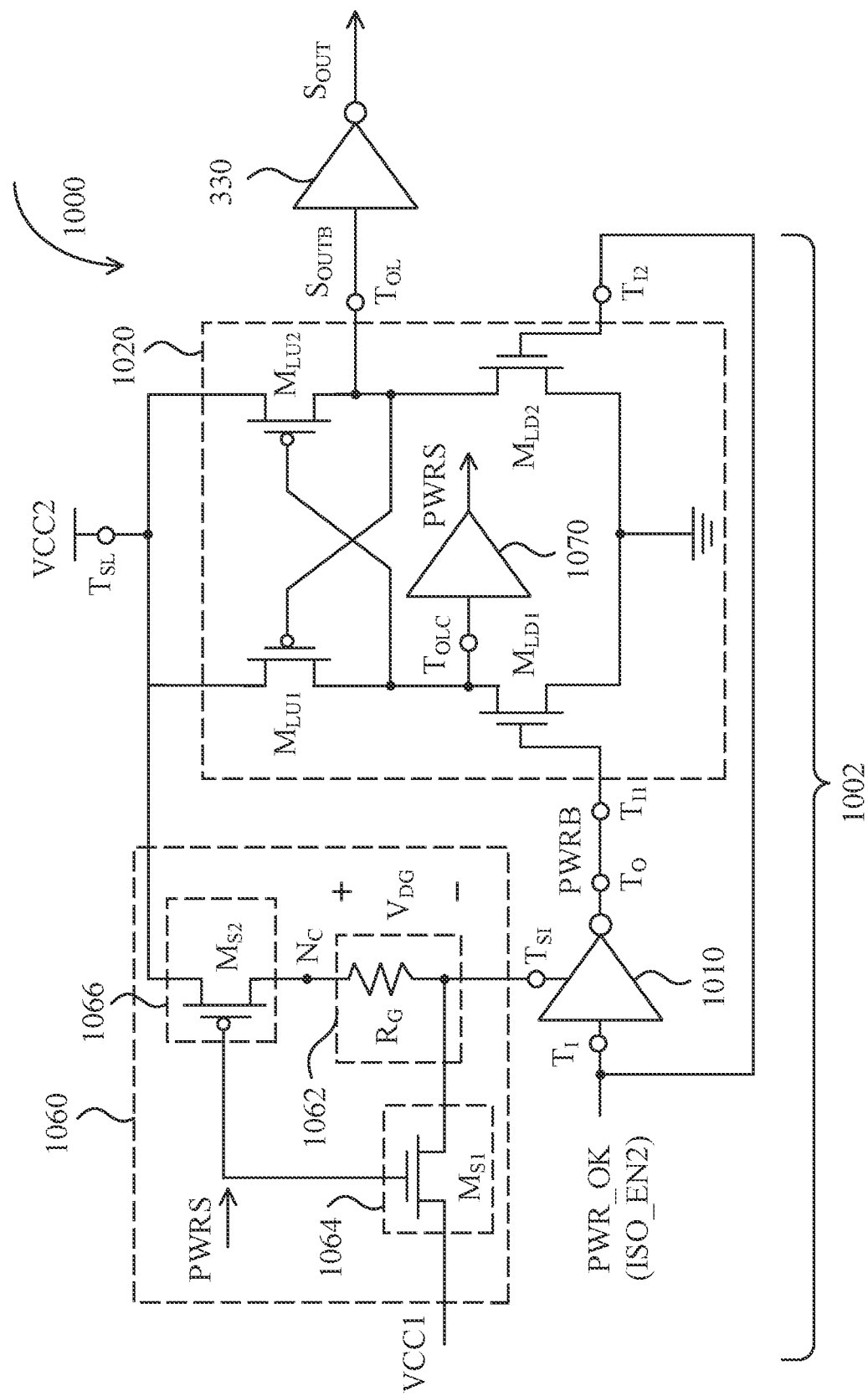
FIG. 10 illustrates an implementation of the power management circuit shown in FIG. 2 in accordance with some embodiments of the present disclosure.

FIG. 10 illustrates an implementation of the power management circuit 200 shown in FIG. 2 in accordance with some embodiments of the present disclosure. In the present embodiment, the power management circuit 1000 can be configured to perform power isolation between different power domains of the integrated circuit 90 shown in FIG. 9. The structure of the power management circuit 1000 is similar to that of the power management circuit 300 shown in FIG. 3 except that, for example, the inverter supply terminal $T_{SI}$ can be selectively coupled to one of the supply voltages VCC1 and VCC2. In the present embodiment, the power management circuit 1000 may include the output buffer 330 shown in FIG. 3, an inverter circuit 1010, a latch circuit 1020, a switch circuit 1060 and an output buffer 1070. The inverter circuit 1010 and the latch circuit 1020 can represent embodiments of the inverter circuit 210 and the latch circuit 220 shown in FIG. 2, respectively.

The latch circuit 1020 may be implemented using, but is not limited to, a cross-coupled inverter pair which includes a plurality of transistors $M_{LU1}$, $M_{LD1}$, $M_{LU2}$ and $M_{LD2}$. The latch input terminal $T_{I1}$, coupled to the gate of the transistor $M_{LD1}$, is configured to receive a voltage signal PWRB generated from the inverter circuit 1010. The latch input terminal $T_{I2}$, coupled to the gate of the transistor $M_{LD2}$, is configured to receive the control signal ISO_EN2 inputted to the inverter circuit 1010. The control signal ISO_EN2 can serve as an embodiment of the control signal CS shown in FIG. 2. The voltage signal PWRB can serve as an embodiment of the control signal CSB shown in FIG. 2. The latch supply terminal $T_{SL}$, coupled to the respective sources of the transistors $M_{LU1}$ and $M_{LU2}$, is configured to receive the supply voltage VCC2. The latch output terminal $T_{OL}$, coupled between the respective drains of the transistors $M_{LU2}$ and $M_{LD2}$, is configured to output the control signal $S_{OUTB}$. Another latch output terminal $T_{OLC}$ of the latch circuit 1020, coupled between the respective drains of the transistors $M_{LU1}$ and $M_{LD1}$, is configured to output an inverse or complement of the control signal $S_{OUTB}$.

The switch circuit 1060 may include a resistive element 1062, a switch 1064 and a switch 1066. The resistive element 1062 is coupled between a circuit node $N_c$ and the inverter supply terminal $T_{SI}$. The resistive element 1062 may be implemented using a resistor $R_G$ in the present embodiment. In some embodiments, the resistive element 1062 can be implemented using at least one resistor, at least one diode, at least one diode-connected transistor, at least one circuit element capable of proving an electrical resistance, and combinations thereof without departing from the scope of the present disclosure. The switch 1064 can be selectively coupled between the supply voltage VCC1 and the inverter supply terminal $T_{SI}$ according to a control signal PWRS, i.e. a signal level at the latch output terminal $T_{OLC}$. The switch 1066 can be selectively coupled between the supply voltage VCC2 and the circuit node $N_c$ according to the control signal PWRS. When one of the switches 1064 and 1066 is turned on, the other of the switches 1064 and 1066 can be turned off. In the present embodiment, the switches 1064 and 1066 can be implemented using the transistors $M_{S1}$ and $M_{S2}$, respectively. In some embodiments, each of the switches 1064 and 1066 can be implemented using other types of switching elements without departing from the scope of the present disclosure.

The output buffer 1070, coupled to the latch output terminal $T_{OLC}$ of the latch circuit 1020, can be configured to buffer the complement of the control signal $S_{OUTB}$ to generate the control signal PWRS. In the present embodiment, the output buffer 1070 may be implemented using a voltage follower operating at the supply voltage VCC2.

Figure 11:
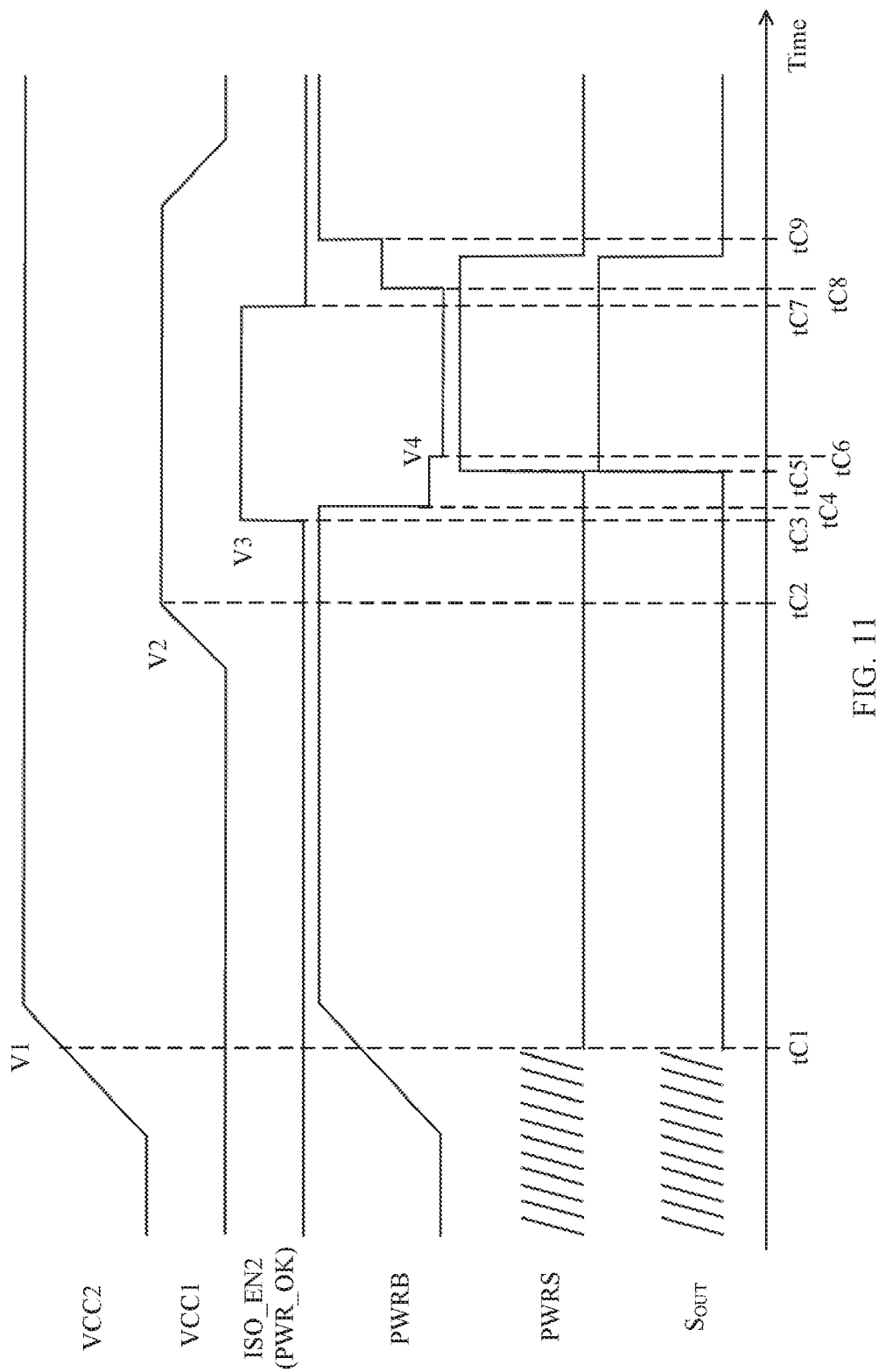
FIG. 11 illustrates signal waveforms associated with operation of the power management circuit shown in FIG. 10 in accordance with some embodiments of the present disclosure.

FIG. 11 illustrates signal waveforms associated with operation of the power management circuit 1000 shown in FIG. 10 in accordance with some embodiments of the present disclosure. Referring to FIG. 11 and also to FIG. 9 and FIG. 10, prior to time tC1, the control signal ISO_EN2 coming from the always-on power domain 14 is a logic low level such as 0V. In the present embodiment, the control signal ISO_EN2 can be implemented using the power good signal PWR_OK. The power good signal PWR_OK of the logic low level can indicate that each of the supply voltages VCC1 and VCC2 is unready. In addition, the voltage signal PWRB may rise in response to the supply voltage VCC2 having a rated level V1, e.g. 3.3V. For example, the inverter circuit 1010 may be implemented using the inverter circuit 310 shown in FIG. 3. The supply voltage VCC2 can be applied to the inverter output terminal $T_O$ through the resistive element 1062 and a p-channel transistor, such as the transistor $M_{PI}$ shown in FIG. 3, since the power good signal PWR_OK inputted to a gate of the p-channel transistor is the logic low level.

At time tC1, the difference between the respective signal levels at the latch input terminals $T_{I1}$ and $T_{I2}$, e.g. |PWRB−PWR_OK|, reaches or exceeds a transition threshold, e.g. 0.9V, since the voltage signal PWRB reaches or rises above a threshold level. The control signal PWRS may be a logic low level which is valid in the power domain 12, e.g. 0V. The control signal $S_{OUTB}$ may be a logic high level which is valid in the power domain 12, e.g. 3.3V. As a result, the control signal $S_{OUT}$ operative in the power domain 12 may be the logic low level to indicate that each of the supply voltages VCC1 and VCC2 is unready. In addition, as the control signal PWRS may stay at the logic low level in response to the power good signal PWR_OK, the switch 1064 is turned off and the switch 1066 is turned on before the supply voltage VCC becomes ready.

At time tC2, the supply voltage VCC1 reaches a rated level V2 thereof, e.g. 1.2V. After a delay time, the power good signal PWR_OK goes to a logic high level V3, e.g. 1.2V, at time tC3. At time tC4, the voltage signal PWRB may fall to a voltage level V4, which is equal to or substantially equal to a voltage drop $V_{DG}$ subtracted from the supply voltage VCC2. The voltage drop $V_{DG}$ is produced according to a current signal flowing through the resistor RG. By way of example but not limitation, the voltage level V4 may be close to 0V, such as 0.2V.

At time tC5, as the difference between the respective signal levels at the latch input terminals $T_{I1}$ and $T_{I2}$, e.g. |PWR_OK−PWRB|, reaches or exceeds a transition threshold, e.g. 0.9V, each of the control signal PWRS and the control signal $S_{OUT}$ may transition to the logic high level in the power domain 12, e.g. 3.3V. As the control signal PWRS may stay at the logic high level in response to the power good signal PWR_OK, the switch 1064 is turned on and the switch 1066 is turned off when each of the supply voltages VCC1 and VCC2 is ready. At time tC6, the voltage signal PWRB may decrease to the logic low level in the power domain 11, e.g. 0V, since the switch 1064 is turned on to thereby couple the supply voltage VCC1 to the inverter input terminal $T_I$.

At time tC7, the PCM 16 may be configured to dessert the power good signal PWR_OK, i.e. the control signal ISO_EN2, to power down the power domain 11. The power good signal PWR_OK may transition from the logic high level to the logic low level in the always-on power domain 14. At time tC8, as the difference between the respective signal levels at the latch input terminals $T_{I1}$ and $T_{I2}$, e.g. |PWRB−PWR_OK|, reaches or exceeds a transition threshold, e.g. 0.9V, each of the control signal PWRS and the control signal $S_{OUT}$ may transition to the logic low level in the power domain 12. The voltage signal PWRB may rise to a voltage level substantially equal to the rated level V2 of the supply voltage VCC1, e.g. 1.2V. At time tC9, the supply voltage VCC2 is coupled to the inverter supply terminal $T_I$ through the resistive element 1062 since the switch 1066 is turned on according to the control signal PWRS. The voltage signal PWRB may rise to the rated level V1 of the supply voltage VCC2.

With the use of the power good signal PWR_OK indicating the power status of the supply voltage VCC1, the power management circuit 1000 may isolate the power domain 11 from the one or more circuit blocks in the power domain 12, such as the PMA 961, when the supply voltage VCC is unready or not ready for use. In addition, when each of the supply voltages VCC1 and VCC2 is ready, the power management circuit 1000 may generate the control signal $S_{OUTB}/S_{OUT}$ operative in the power domain 12 to thereby allow the power domain 11 to be coupled to the one or more circuit blocks.

Figure 12:
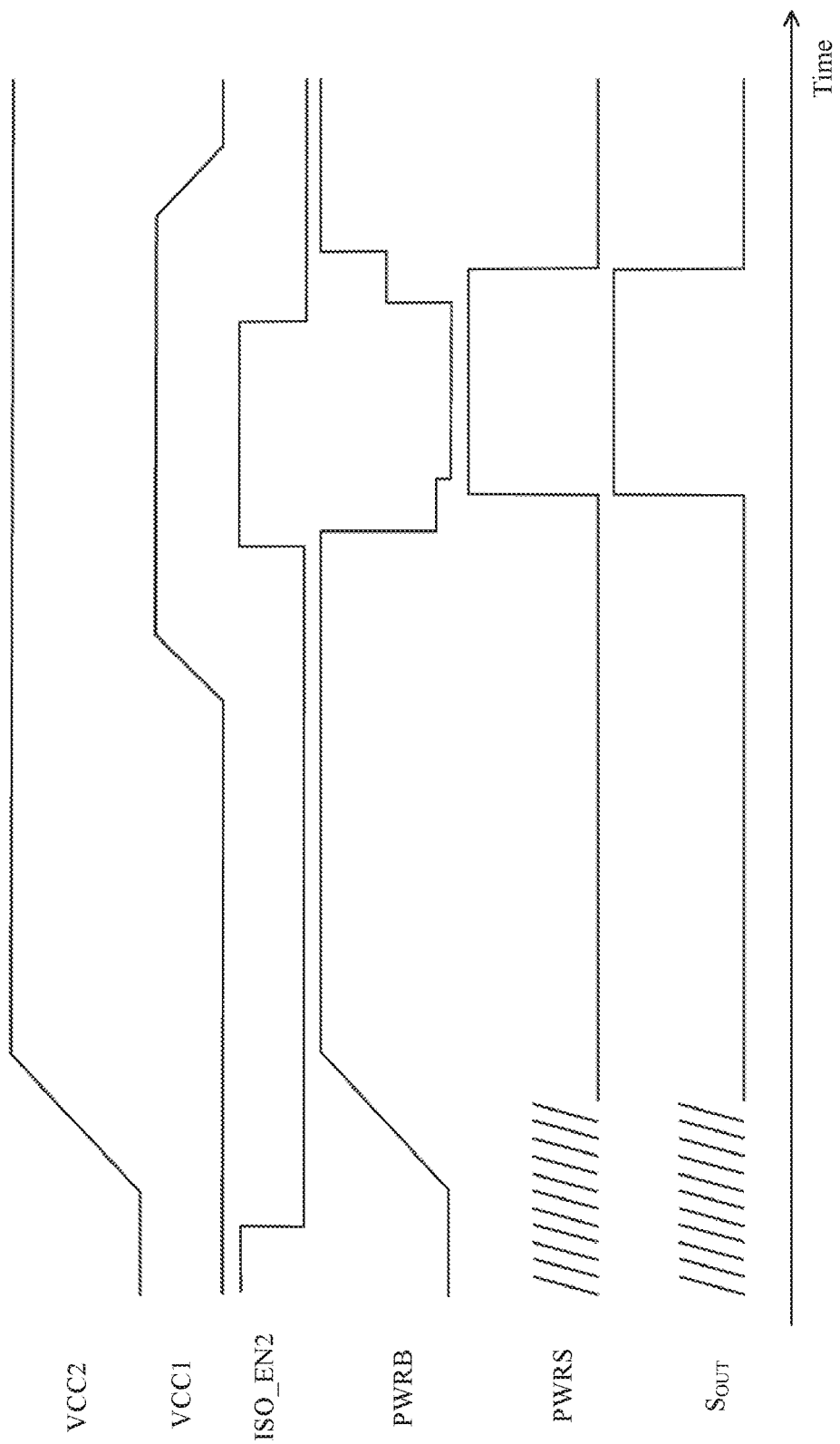
FIG. 12 illustrates signal waveforms associated with operation of the power management circuit shown in FIG. 10 in accordance with some embodiments of the present disclosure.

In some embodiments, the control signal ISO_EN2 may further carry power status information of the supply voltage VCC2. When one of the supply voltages VCC1 and the VCC2 is ready while the other is unready, e.g. during power-on sequencing, the control signal ISO_EN2 is at a first level, e.g. one of a logic high level and a logic low level. When each of the supply voltages VCC1 and the VCC2 is ready, the control signal ISO_EN2 is at a second level different from the first level. FIG. 12 illustrates signal waveforms associated with operation of the power management circuit 1000 shown in FIG. 10 in accordance with some embodiments of the present disclosure. The signal waveforms shown in FIG. 12 are similar/identical to those shown in FIG. 11 except that, for example, the control signal ISO_EN2 is the logic high level before the supply voltage VCC2 becomes ready. In addition, when the supply voltage VCC2 is ready and the supply voltage VCC1 is unready, the control signal ISO_EN2 may stay at the logic low level. When each of the supply voltage VCC1 and the supply voltage VCC2 is ready, the control signal ISO_EN2 may transition back to the logic high level. As those skilled in the art can appreciate operation of the power management circuit 1000 shown in FIG. 10 employing the signal waveforms shown in FIG. 12 after reading the above paragraphs directed to FIG. 1 through FIG. 11, further description is omitted here for brevity.

Figure 13:
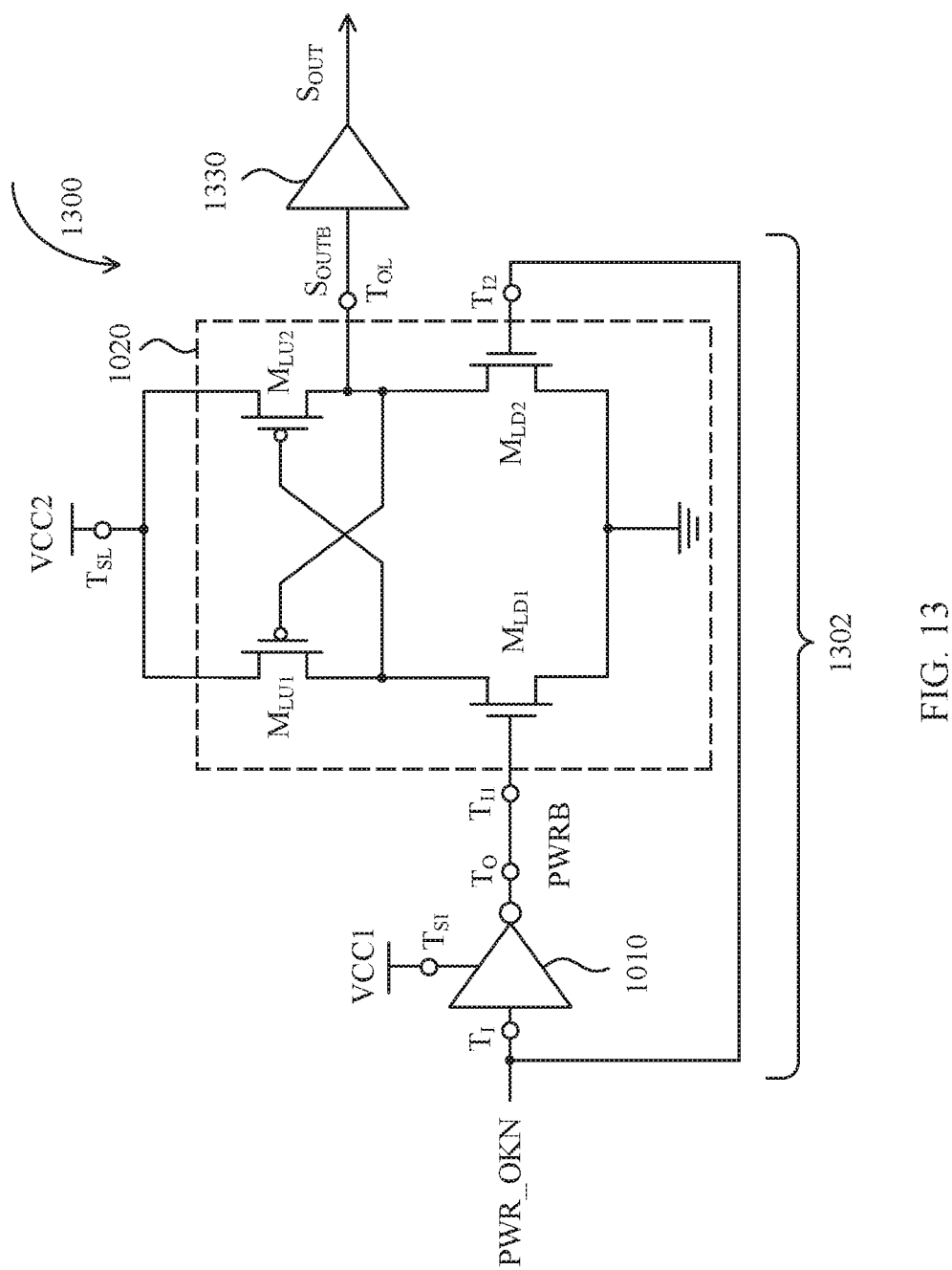
FIG. 13 illustrates an implementation of the power management circuit shown in FIG. 2 in accordance with some embodiments of the present disclosure.

In some embodiments, the proposed power management scheme may utilize an inverted signal of a power good signal, provided from an always-on power domain, to perform power isolation. FIG. 13 illustrates an implementation of the power management circuit 200 shown in FIG. 2 in accordance with some embodiments of the present disclosure. The power management circuit 1300 can be configured to perform power isolation between different power domains of the integrated circuit 90 shown in FIG. 9. The structure of the power management circuit 1300 is similar to that of the power management circuit 1000 shown in FIG. 10 except that, for example, the supply voltage VCC1 can be coupled to the inverter supply terminal $T_{SI}$ before becoming ready. In addition, an output buffer 1330 may be implemented using a voltage follower. In the present embodiment, the power management circuit 1300 may utilize a power status signal PWR_OKN, which is an inverted signal of the power good signal PWR_OK shown in FIG. 9, to perform power isolation. The power status signal PWR_OKN can serve as an embodiment of the control signal ISO_EN2 shown in FIG. 9.

Figure 14:
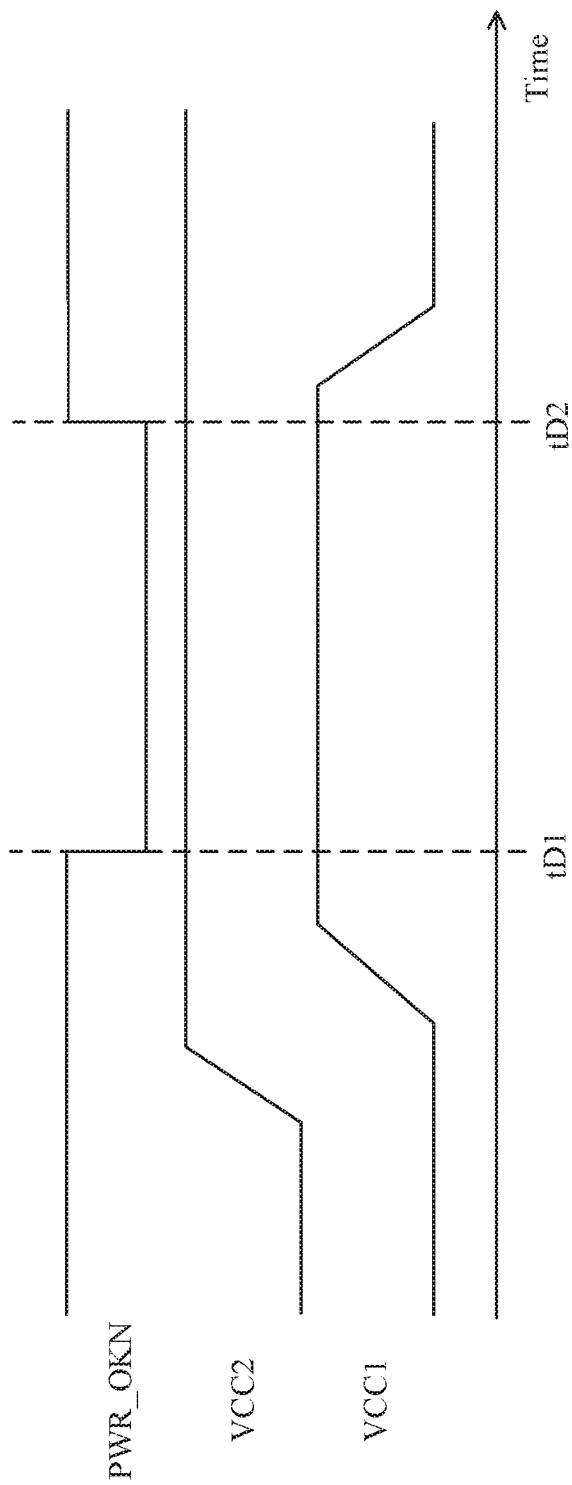
FIG. 14 illustrates signal waveforms associated with operation of the power management circuit shown in FIG. 13 in accordance with some embodiments of the present disclosure.

FIG. 14 illustrates signal waveforms associated with operation of the power management circuit 1300 shown in FIG. 13 in accordance with some embodiments of the present disclosure. Referring to FIG. 14 and also to FIG. 9 and FIG. 13, prior to time tD1, the power status signal PWR_OKN may stay at a logic high level to indicate that not each of the supply voltages VCC1 and VCC2 is ready. The voltage signal PRWB inputted to the latch input terminal $T_{I1}$ may be a logic low level. As a result, the signal level at the latch input terminal $T_{I1}$ would be lower than the signal level at the latch input terminal $T_{I2}$. The control signal $S_{OUTB}$ may be a logic low level to indicate that the supply voltage VCC1 is unready. Accordingly, the power management circuit 1300 may generate the control signal $S_{OUT}$ having a logic low level, thereby isolating the power domain 11 from the PMA 961 operating in the power domain 12.

At time tD1, the power status signal PWR_OKN transitions to a logic low level to indicate that each of the supply voltages VCC1 and VCC2 is ready. The signal level at the latch input terminal $T_{I1}$ would be higher than the signal level at the latch input terminal $T_{I2}$. The control signal $S_{OUT}$ may transition to a logic high level. The power management circuit 1300 may generate the control signal $S_{OUT}$ having a logic high level, thereby allowing propagation of signals from the power domain 11 to the PMA 961 operating in the power domain 12. At time tD2, the PCM 16 may be configured to dessert the power good signal PWR_OK to power down the power domain 11. The power status signal PWR_OKN may transition to the logic high level. The power domain 11 may again be isolated from the PMA 961 operating in the power domain 12.

Figure 15:
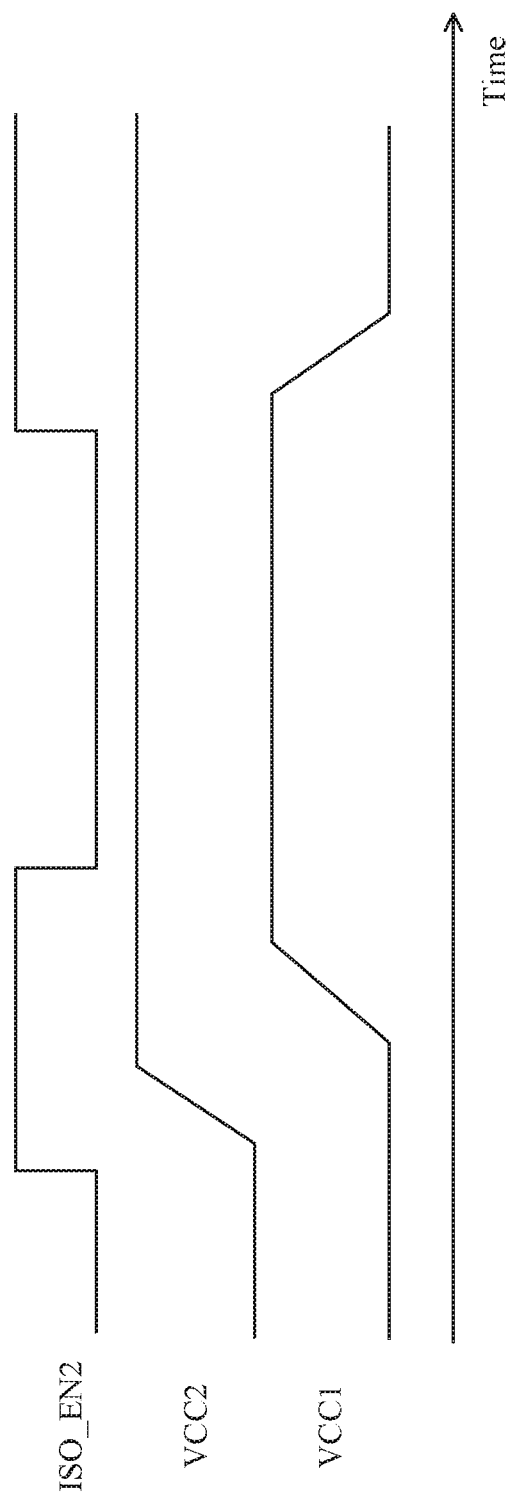
FIG. 15 illustrates signal waveforms associated with operation of the power management circuit shown in FIG. 13 in accordance with some embodiments of the present disclosure.

In some embodiments, the control signal ISO_EN2 may further carry power status information of the supply voltage VCC2. When one of the supply voltages VCC1 and the VCC2 is ready while the other is unready, e.g. during power-on sequencing, the control signal ISO_EN2 is at a first level, e.g. one of a logic high level and a logic low level. When each of the supply voltages VCC1 and the VCC2 is ready, the control signal ISO_EN2 is at a second level different from the first level. FIG. 15 illustrates signal waveforms associated with operation of the power management circuit 1300 shown in FIG. 13 in accordance with some embodiments of the present disclosure. The signal waveforms shown in FIG. 15 are similar/identical to those shown in FIG. 14 except that, for example, the control signal ISO_EN2 is the logic low level before the supply voltage VCC2 becomes ready. In addition, when the supply voltage VCC2 is ready and the supply voltage VCC1 is unready, the control signal ISO_EN2 may transition to the logic high level. When each of the supply voltage VCC1 and the supply voltage VCC2 is ready, the control signal ISO_EN2 may transition back to the logic low level. As those skilled in the art can appreciate operation of the power management circuit 1300 shown in FIG. 13 employing the signal waveforms shown in FIG. 15 after reading the above paragraphs directed to FIG. 1 through FIG. 14, further description is omitted here for brevity.

As described above, the proposed power management scheme may translate a control signal operative in a power domain to a control signal operative in another power domain to thereby perform power control operations. By way example but not limitation, the power management circuit 200/300/1000/1300 described above may be implemented to include a level shifter and an output buffer. In the embodiment shown in FIG. 2, the inverter circuit 210 and the latch circuit 220 may be used to implement at least a portion of the level shifter 202. In the embodiment shown in FIG. 3, the inverter circuit 310, the latch circuit 320 and the resistive element 340 may be used to implement at least a portion of a level shifter 302. In the embodiment shown in FIG. 10, the inverter circuit 1010, the latch circuit 1020 and the switch circuit 1060 may be used to implement at least a portion of a level shifter 1002. In the embodiment shown in FIG. 13, the inverter circuit 1010 and the latch circuit 1020 may be used to implement at least a portion of a level shifter 1302.

Figure 16:
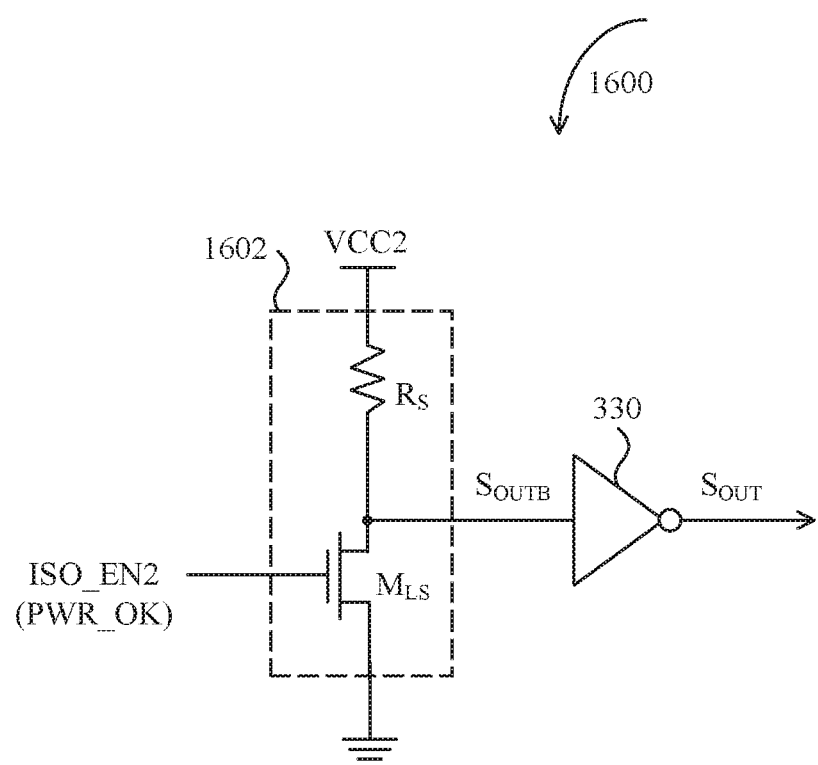
FIG. 16 illustrates an implementation of the power management circuit shown in FIG. 2 in accordance with some embodiments of the present disclosure.

In some embodiments, the proposed power management scheme may utilize a single-ended level shifter and an output buffer to perform power isolation. FIG. 16 illustrates an implementation of the power management circuit 200 shown in FIG. 2 in accordance with some embodiments of the present disclosure. In the present embodiment, the power management circuit 1600 can be configured to perform power isolation between different power domains of the integrated circuit 90 shown in FIG. 9. Also, the power management circuit 1600 may be implemented to include a single-ended level shifter.

Referring to FIG. 16 and also to FIG. 9, the power management circuit 1600 may include the output buffer 330 shown in FIG. 3 and a level shifter 1602. The level shifter 1602, supplied by the supply voltage VCC2 operative in the power domain 12, can be configured to translate the control signal ISO_EN2 to the control signal $S_{OUTB}$ operative in the power domain 12. In the present embodiment, the level shifter 1062 includes a transistor $M_{LS}$ and a resistive element $R_S$ such as a resistor. Additionally, the control signal ISO_EN2 used for controlling a switching status of the transistor $M_{LS}$ may be implemented using a power status signal such as the power good signal PWR_OK.

In operation, before the supply voltage VCC1 becomes ready, the power good signal PWR_OK is a logic low level. The transistor $M_{LS}$ is turned off. The control signal $S_{OUTB}$ may be a logic high level, e.g. a rated level of the supply voltage VCC2. The control signal $S_{OUT}$ may be a logic low level to indicate that the supply voltage VCC1 is unready. The power management circuit 1600 may isolate the power domain 11 from the PMA 961 in the power domain 12 according to the control signal $S_{OUT}$. When each of the supply voltages VCC1 and VCC2 is ready, the power good signal PWR_OK transitions from the logic low level to a logic high level to turn on the transistor $M_{LS}$. The control signal $S_{OUTB}$ may transition to the logic low level. The control signal $S_{OUT}$ may transition to the logic high level, which indicates that each of the supply voltages VCC1 and VCC2 is ready. The power management circuit 1600 may allow the power domain 11 to be coupled to the PMA 961 in the power domain 12 according to the control signal $S_{OUT}$.

It is worth noting that the proposed power management scheme may utilize a single control signal, such as a power status signal directly provided from an always-on power domain, to perform power isolation between various power domains. In some embodiments, referring again to FIG. 9 and FIG. 13, the power management circuit 900 may be configured to isolate the power domain 11 from one or more circuit blocks in the power domain 13 according to the control signal ISO_EN2 since the control signal ISO_EN2 can be translated to a control signal operative in the power domain 13. For example, when the power management circuit 900 is configured to isolate the power domain 11 from the GPU 94 in the power domain 13, the inverter circuit 1010 and the latch circuit 1020 may be supplied by the supply voltage VCC1 and VCC3. The level shifter 1302 may still receive the power status signal PWR_OKN to translate the power status signal PWR_OKN to the control signal $S_{OUTB}$, which may be operative in the power domain VCC3. With the use of the proposed power management scheme, a single control signal can be used for power isolation between various power domains, thus reducing circuit chip area and power consumption.

Figure 17:
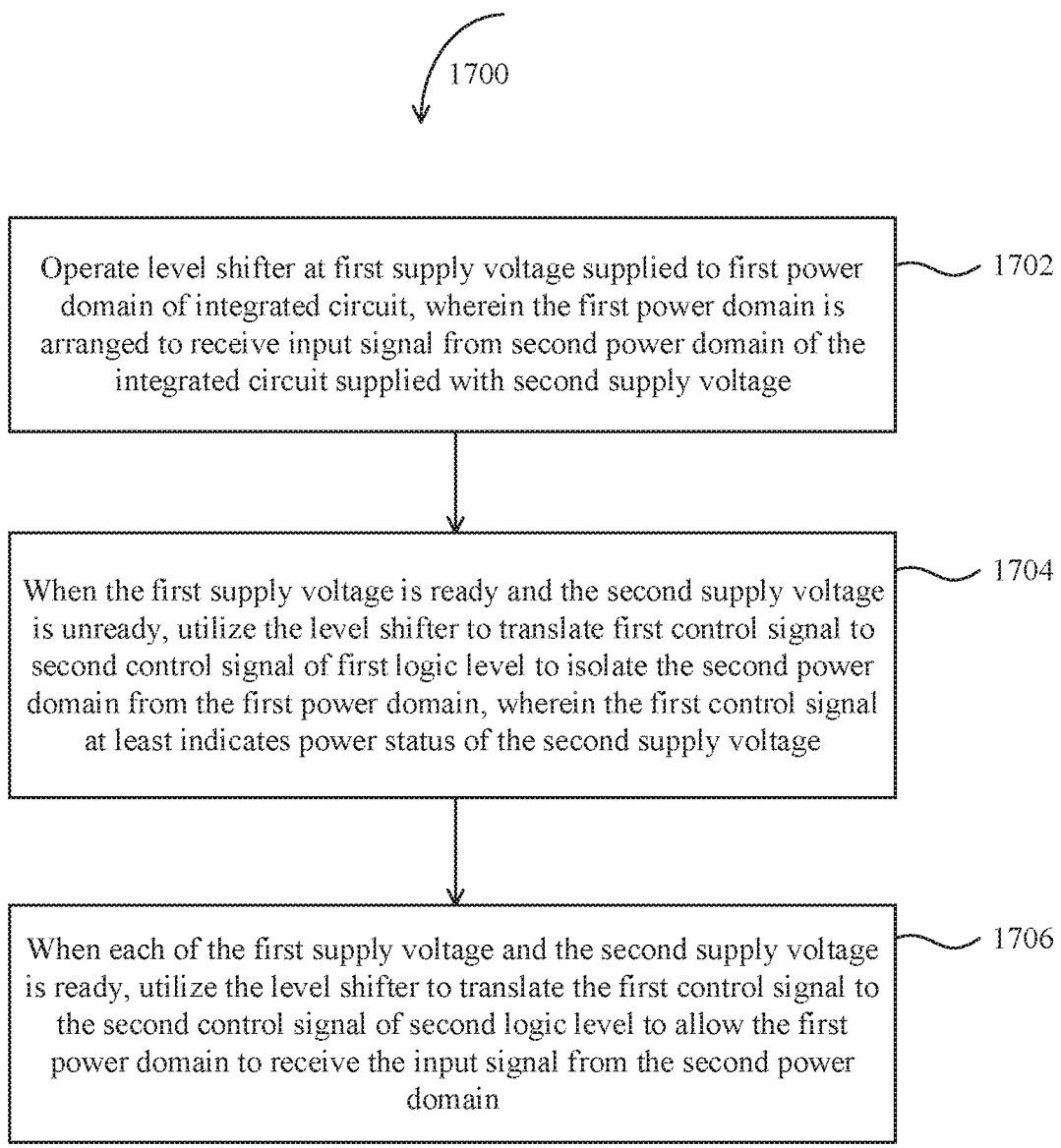
FIG. 17 is a flow chart of an exemplary method for managing an integrated circuit in accordance with some embodiments of the present disclosure.

FIG. 17 is a flow chart of an exemplary method for managing an integrated circuit in accordance with some embodiments of the present disclosure. The method 1700 is described with reference to the integrated circuit 90 shown in FIG. 9 for illustrative purposes. Those skilled in the art should appreciate that the method 1700 can be employed in the integrated circuit 10 shown in FIG. 1 or other integrated circuits having multiple power domains without departing from the scope of the present disclosure. The method 1700 is also described with reference to the level shifter 202 shown in FIG. 2. Those skilled in the art can appreciate that the method 1700 can be implemented utilizing other level shifters, such as the level shifter 302 show in FIG. 3, the level shifter 1002 show in FIG. 10, the level shifter 1302 show in FIG. 13, the level shifter 1602 show in FIG. 16 or other types of level shifters without departing from the scope of the present disclosure. Additionally, in some embodiments, other operations in the method 1700 can be performed. In some embodiments, operations of the method 1700 can be performed in a different order and/or vary. In some other embodiments, one or more operations of the method 1700 may be optional.

At operation 1702, a level shifter is used and operates at a first supply voltage supplied to a first power domain of the integrated circuit. The first power domain is arranged to receive an input signal from a second power domain of the integrated circuit supplied with a second supply voltage. For example, the level shifter 202 is supplied with the supply voltage VCC2 in the power domain 12. The PMA 961 in power domain 12 may be configured to receive an input signal, such as a data input or a control input, from the PCS 962 in the power domain 11 supplied with the supply voltage VCC1.

At operation 1704, when the first supply voltage is ready and the second supply voltage is unready, utilizing the level shifter to translate a first control signal to a second control signal of a first logic level to isolate the second power domain from the first power domain, wherein the first control signal at least indicates a power status of the second supply voltage. For example, the level shifter 202 may be implemented in the power management circuit 900. When the supply voltage VCC2 is ready and the supply voltage VCC1 is unready, the level shifter 202 can be configured to translate the control signal CS to the control signal $S_{OUTB}$ of a first logic level, e.g. one of a logic high level and a logic low level, to isolate the 11 power domain from the power domain 12. As a result, the input signal, which may have an unknown state sent from the power domain 11, will be isolated from the power domain 12. The PCS 962 in the power domain 11 can be uncoupled from the PMA 961 in the power domain 12.

In some embodiments, the control signal CS shown in FIG. 2 may be implemented using a power status signal provided from the always-on power domain 14. In some embodiments, the control signal CS shown in FIG. 2 may be implemented using a power status signal capable of indicating if the supply voltage VCC1 is ready. In some embodiments, the control signal CS shown in FIG. 2 may be implemented using a power status signal capable of indicating if each of the supply voltage VCC1 and the supply voltage VCC2 is ready. For example, the control signal CS may be implemented using the power good signal PWR_OK sent from the PCM 16. As another example, the control signal CS may be implemented using an inverted signal of the power good signal PWR_OK sent from the PCM 16. As another example, the control signal CS may be implemented the control signal ISO_EN2 having a signal waveform similar/identical to that shown in FIG. 11, FIG. 12, FIG. 14 or FIG. 15.

At operation 1706, when each of the first supply voltage is ready and the second supply voltage is ready, utilizing the level shifter to translate the first control signal to the second control signal of a second logic level to allow the second power domain to receive the input signal from the first power domain. For example, when each of the supply voltage VCC1 and the supply voltage VCC2 is ready, the level shifter 202 can be configured to translate the control signal CS to the control signal $S_{OUTB}$ of a second logic level, e.g. the other of the logic high level and the logic low level, to allow the power domain 12 to receive the input signal from the power domain 11. As a result, the input signal provided from the power domain 11 can be transmitted to the power domain 12. The PCS 962 in the power domain 11 can be allowed to be coupled to the PMA 961 in the power domain 12.

As those skilled in the art can appreciate operation of the method 1700 after reading the above paragraphs directed to FIG. 1 through FIG. 16, further description is omitted here for brevity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power management circuit for an integrated circuit, the power management circuit comprising:
    an inverter circuit, having an inverter input terminal, an inverter output terminal and an inverter supply terminal, the inverter circuit being configured to receive a first control signal from the inverter input terminal and generate a second control signal at the inverter output terminal, the first control signal carrying power status information of a first supply voltage supplied to the integrated circuit, the inverter supply terminal being coupled to a second supply voltage supplied to the integrated circuit, the second supply voltage becoming ready before the first supply voltage; and
    a latch circuit, having a first latch input terminal and a second latch input terminal, the first latch input terminal being coupled to the inverter output terminal to receive the second control signal, the second latch input terminal being coupled to the inverter input terminal to receive the first control signal, the latch circuit being configured to generate a third control signal according to respective signal levels of the first control signal and the second control signal, and accordingly perform power control of the integrated circuit;
    wherein the first control signal and the second supply voltage are operative in different power domains of the integrated circuit; when each of the first supply voltage and the second supply voltage is ready, each of the inverter input terminal and the second latch input terminal is arranged to receive the first control signal at a signal level lower than a signal level of the second supply voltage.

2. The power management circuit of claim 1, wherein when the power status information indicates that the first supply voltage is unready, one of the signal level of the first control signal and the signal level of the second control signal is higher than the other of the signal level of the first control signal and the signal level of the second control signal; when the power status information indicates that the first supply voltage is ready, the one of the signal level of the first control signal and the signal level of the second control signal is lower than the other of the signal level of the first control signal and the signal level of the second control signal.

3. The power management circuit of claim 1, wherein when the power status information indicates that the first supply voltage is unready, the latch circuit is configured to generate the third control signal to hold the integrated circuit in a reset state; when the power status information indicates that the first supply voltage is ready, the latch circuit is configured to generate the third control signal to release the integrated circuit from the reset state.

4. The power management circuit of claim 1, wherein the latch circuit comprises a latch supply terminal, and each of the inverter supply terminal and the latch supply terminal is coupled to the second supply voltage.

5. The power management circuit of claim 1, further comprising:
    a resistive element, wherein the inverter supply terminal of the inverter circuit is arranged to be coupled to the second supply voltage through the resistive element; and
    a delay element, coupled to the inverter input terminal, the delay element arranged to receive the first supply voltage and output a delayed version of the first supply voltage to the inverter input terminal, the delayed version of the first supply voltage serving as the first control signal.

6. The power management circuit of claim 5, wherein during a ramp-up period of the first supply voltage, the delayed version of the first supply voltage ramps up to a reference level when the first supply voltage ramps up to a first threshold level; during a ramp-down period of the first supply voltage, the delayed version of the first supply voltage ramps downs to the reference level when the first supply voltage ramps down to a second threshold level lower than the first threshold level.

7. A power management circuit for an integrated circuit, the power management circuit comprising:
    an inverter circuit, having an inverter input terminal, an inverter output terminal and an inverter supply terminal, the inverter circuit being configured to receive a first control signal from the inverter input terminal and generate a second control signal at the inverter output terminal, the first control signal carrying power status information of a first supply voltage supplied to the integrated circuit, the inverter supply terminal being coupled to the first supply voltage; and
    a latch circuit, having a latch supply terminal, a first latch input terminal and a second latch input terminal, the latch supply terminal being coupled to a second supply voltage supplied to the integrated circuit, the second supply voltage becoming ready before the first supply voltage, the first latch input terminal being coupled to the inverter output terminal to receive the second control signal, the second latch input terminal being coupled to the inverter input terminal to receive the first control signal, the latch circuit being configured to generate a third control signal according to respective signal levels of the first control signal and the second control signal, and accordingly perform power control of the integrated circuit;
    wherein the first control signal stays at a same logic level during a period of time in which at least one of a level transition of the first supply voltage and a level transition of the second supply voltage occurs; the first control signal transitions to another logic level after the first supply voltage transitions to a first predetermined voltage level to become ready and after the second supply voltage transitions to a second predetermined voltage level to become ready.

8. The power management circuit of claim 7, wherein the latch circuit further comprises a first latch output terminal and a second latch output terminal, and the first latch output terminal is arranged to output the third control signal; the power management circuit further comprises:
    a resistive element, coupled between a circuit node and the inverter supply terminal of the inverter circuit;
    a first switch, selectively coupled between the first supply voltage and the inverter supply terminal according to a signal level at the second latch output terminal; and a second switch, selectively coupled between the second supply voltage and the circuit node according to the signal level at the second latch output terminal;

wherein the logic level is a logic low level, and the another logic level is a logic high level; when the first supply voltage is unready, the first switch is turned off and the second switch is turned on; when each of the first supply voltage and the second supply voltage is ready, the first switch is turned on and the second switch is turned off.

9. The power management circuit of claim 7, wherein the integrated circuit comprises a first power domain supplied with the first supply voltage and a second power domain supplied with the second supply voltage; when the power status information indicates that the first supply voltage is unready, the latch circuit is configured to generate the third control signal to isolate the first power domain from a portion of the integrated circuit operating in the second power domain; when the power status information indicates that the first supply voltage is ready, the latch circuit is configured to generate the third control signal to allow the first power domain to be coupled to the portion of the integrated circuit.

10. The power management circuit of claim 7, wherein the first control signal is provided from an always-on power domain.

11. The power management circuit of claim 7, wherein the first control signal further carries power status information of the second supply voltage;

when each of the first supply voltage and the second supply voltage is unready, the first control signal is the another logic level; when the second supply voltage is ready and the first supply voltage is unready, the first control signal is the logic level;

when each of the first supply voltage and the second supply voltage is ready, the first control signal is the another logic level.

12. A power management circuit for an integrated circuit, the power management circuit comprising:

a level shifter, supplied at least by a first supply voltage operative in a first power domain of the integrated circuit, the level shifter being configured to translate a first control signal to a second control signal operative in the first power domain, the first control signal indicating a power status of a second supply voltage operative in a second power domain of the integrated circuit, the first supply voltage becoming ready before the second supply voltage, the second power domain being different from the first power domain, wherein the first control signal is operative in a third power domain different from the second power domain; before the second supply voltage operative in the second power domain becomes ready, the first control signal operative in the third power domain stays at a first logic level during a level transition of the second supply voltage; after the second supply voltage transitions to a predetermined voltage level to become ready, the first control signal stays at a second logic level different from the first logic level; and an output buffer, coupled to the level shifter, the output buffer being configured to buffer the second control signal to generate a third control signal, and accordingly perform power control of the integrated circuit.

13. The power management circuit of claim 12, wherein when the first control signal indicates that the second supply voltage is unready, the output buffer is configured to generate the third control signal to isolate the second power domain from a portion of the integrated circuit operating in the first power domain; when the first control signal indicates that the second supply voltage is ready, the output buffer is configured to generate the third control signal to allow the second power domain to be coupled to the portion of the integrated circuit.

14. The power management circuit of claim 12, wherein the level shifter comprises:

an inverter circuit, having an inverter input terminal and an inverter output terminal, the inverter circuit being configured to receive the first control signal from the inverter input terminal and generate a fourth control signal at the inverter output terminal; and a latch circuit, having a latch supply terminal, a first latch input terminal and a second latch input terminal, the latch supply terminal being coupled to the first supply voltage, the first latch input terminal being coupled to the inverter output terminal to receive the fourth control signal, the second latch input terminal being coupled to the inverter input terminal to receive the first control signal, the latch circuit being configured to generate the second control signal according to respective signal levels of the first control signal and the fourth control signal.

15. The power management circuit of claim 14, wherein an inverter supply terminal of the inverter circuit is arranged to receive the second supply voltage; the first logic level is a logic high level, and the second logic level is a logic low level.

16. The power management circuit of claim 14, wherein the latch circuit comprises a first latch output terminal and a second latch output terminal, and the first latch output terminal is arranged to output the second control signal; the level shifter further comprises:

a resistive element, coupled between a circuit node and an inverter supply terminal of the inverter circuit;

a first switch, selectively coupled between the first supply voltage and the circuit node according to a signal level at the second latch output terminal; and a second switch, selectively coupled between the second supply voltage and the inverter supply terminal according to the signal level at the second latch output terminal;

wherein the first logic level is a logic low level, and the second logic level is a logic high level; when the second supply voltage is unready, the first switch is turned on and the second switch is turned off; when each of the first supply voltage and the second supply voltage is ready, the first switch is turned off and the second switch is turned on.

17. The power management circuit of claim 12, wherein the first control signal further indicates a power status of the first supply voltage; when each of the first supply voltage and the second supply voltage is unready, the first control signal is the second logic level; when the first supply voltage is ready and the second supply voltage is unready, the first control signal is the first logic level; when each of the first supply voltage and the second supply voltage is ready, the first control signal is the second logic level.

18. The power management circuit of claim 12, wherein the third power domain is an always-on power domain.

19. A method for managing an integrated circuit, comprising:

operating a level shifter at a first supply voltage supplied to a first power domain of the integrated circuit, wherein the first power domain is arranged to receive an input signal from a second power domain of the integrated circuit supplied with a second supply voltage;

when the first supply voltage supplied to the first power domain is ready and the second supply voltage supplied to the second power domain is unready, utilizing the level shifter to receive a first control signal, provided from a third power domain different from the second power domain and staying at a first logic level during a level transition of the second supply voltage, and translate the first control signal to a second control signal to isolate the second power domain from the first power domain, wherein the first control signal at least indicates a power status of the second supply voltage; and when each of the first supply voltage and the second supply voltage is ready, switching the first control signal from the first logic level to a second logic level different from the first logic level, and utilizing the level shifter to translate the first control signal of the second logic level to the second control signal to allow the first power domain to receive the input signal from the second power domain.

20. The method for claim 19, wherein the third power domain is an always-on power domain, and the power status signal indicates if each of the first supply voltage and the second supply voltage is ready.

* * * * *